(12) United States Patent
Imanishi

(10) Patent No.: US 12,255,489 B2
(45) Date of Patent: Mar. 18, 2025

(54) UNINTERRUPTIBLE POWER SUPPLY SYSTEM

(71) Applicant: TMEIC Corporation, Chuo-ku (JP)

(72) Inventor: Ryogo Imanishi, Chuo-ku (JP)

(73) Assignee: TMEIC CORPORATION, Chuo-ku (JP)

( * ) Notice: Subject to any disclaimer, the term of this patent is extended or adjusted under 35 U.S.C. 154(b) by 0 days.

(21) Appl. No.: 18/553,594

(22) PCT Filed: Feb. 4, 2022

(86) PCT No.: PCT/JP2022/004507
§ 371 (c)(1),
(2) Date: Oct. 2, 2023

(87) PCT Pub. No.: WO2023/148935
PCT Pub. Date: Aug. 10, 2023

(65) Prior Publication Data
US 2024/0364134 A1    Oct. 31, 2024

(51) Int. Cl.
*H02J 9/06* (2006.01)
*G01R 31/42* (2006.01)

(52) U.S. Cl.
CPC .............. *H02J 9/062* (2013.01); *G01R 31/42* (2013.01)

(58) Field of Classification Search
CPC ................................ H02J 9/062; G01R 31/42
USPC ......................................................... 307/65
See application file for complete search history.

(56) References Cited

U.S. PATENT DOCUMENTS 7,638,899 B2 * 12/2009 Tracy .................... H02M 7/493
307/64
9,160,202 B2 * 10/2015 Colombi ............... H02J 3/0073

FOREIGN PATENT DOCUMENTS

JP    2020-5410 A    1/2020

OTHER PUBLICATIONS

International Search Report issued Apr. 5, 2022 in PCT/JP2022/004507 filed on Feb. 4, 2022 citing document 15 therein, 2 pages.

* cited by examiner

*Primary Examiner* — Michael R. Fin
(74) *Attorney, Agent, or Firm* — Oblon, McClelland, Maier & Neustadt, L.L.P.

(57) ABSTRACT

An uninterruptible power supply system that includes a selection unit that selects, of a plurality of uninterruptible power supply devices, a necessary number of uninterruptible power supply devices to supply power to a load. Each of the uninterruptible power supply devices performs, when this device is selected, an operating action of supplying power to the load, when this device is not selected, a standby action of not supplying power to the load, and during the standby action, a diagnostic action of diagnosing whether or not a predetermined part of this device has a failure. The selection unit changes uninterruptible power supply devices to be selected, such that the plurality of uninterruptible power supply devices have an equal operating time.

12 Claims, 15 Drawing Sheets

UNINTERRUPTIBLE POWER SUPPLY SYSTEM

TECHNICAL FIELD

The present disclosure relates to an uninterruptible power supply system, and particularly to an uninterruptible power supply system including a plurality of uninterruptible power supply devices connected in parallel to a load.

BACKGROUND ART

Japanese Patent Laying-Open No. 2020-005410 (PTL 1), for example, discloses an uninterruptible power supply system including a plurality of uninterruptible power supply devices connected in parallel to a load. In this system, of the plurality of uninterruptible power supply devices, the number of uninterruptible power supply devices that are required to supply power to the load is selected. The selected uninterruptible power supply devices are put into an operating state of supplying power to the load, and the unselected uninterruptible power supply device is put into a standby state of not supplying power to the load. In addition, the uninterruptible power supply devices to be selected are changed, such that the plurality of uninterruptible power supply devices have an equal operating time.

CITATION LIST

Patent Literature

PTL 1: Japanese Patent Laying-Open No. 2020-005410

SUMMARY OF INVENTION

Technical Problem

A plurality of electrical components mounted on an uninterruptible power supply device deteriorate over time depending on how they are used and the environment in which they are used. The electrical components may not operate properly as they deteriorate over time, and thus the uninterruptible power supply device in an operating state may suddenly fail, which stops the operation of a load.

Therefore, a main object of the present disclosure is to provide an uninterruptible power supply system that can prevent an uninterruptible power supply device in an operating state from failing.

Solution to Problem

An uninterruptible power supply system according to the present disclosure is an uninterruptible power supply system including a plurality of uninterruptible power supply devices connected in parallel to a load, and including a selection unit that selects, of the plurality of uninterruptible power supply devices, a necessary number of uninterruptible power supply devices to supply power to the load.

Each of the uninterruptible power supply devices performs: when this uninterruptible power supply device is selected by the selection unit, an operating action of supplying power to the load; when this uninterruptible power supply device is not selected by the selection unit, a standby action of standing by without supplying power to the load; and during the standby action, a diagnostic action of diagnosing whether or not a predetermined part of this uninterruptible power supply device has a failure. The selection unit changes uninterruptible power supply devices to be selected, such that the plurality of uninterruptible power supply devices have an equal operating time.

Advantageous Effects of Invention

In the uninterruptible power supply system according to the present disclosure, of the plurality of uninterruptible power supply devices, the selected uninterruptible power supply devices are put into an operating state, the unselected uninterruptible power supply device is put into a standby state, and a failure diagnosis of a predetermined part is conducted in the uninterruptible power supply device that has been put into the standby state. Therefore, it is possible to replace the uninterruptible power supply device that has been diagnosed as having a failure at the predetermined part with a new uninterruptible power supply device before this failed device is put into the operating state, thereby preventing the uninterruptible power supply device in the operating state from failing.

DESCRIPTION OF EMBODIMENTS

First Embodiment

Figure 1:
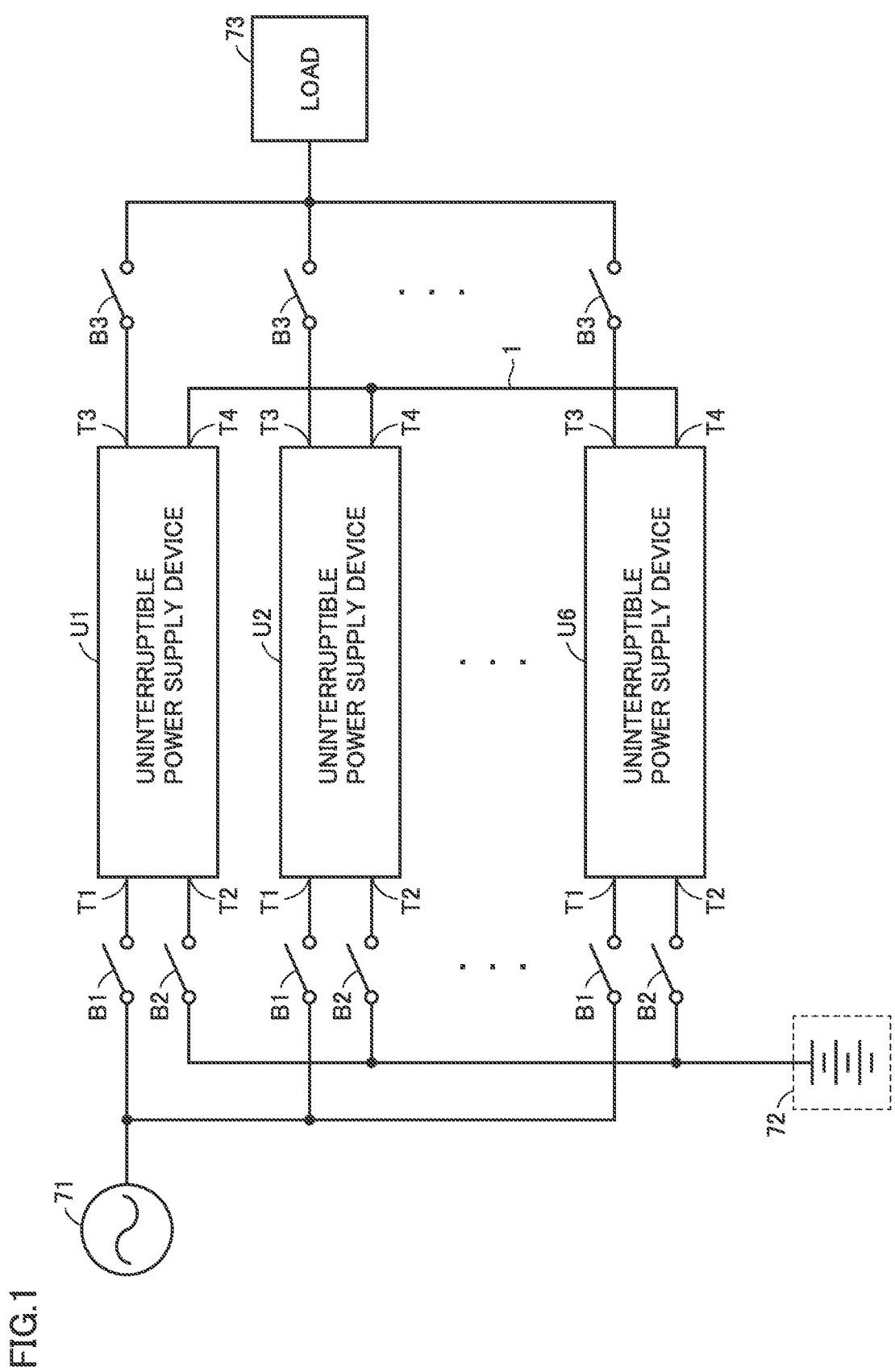
FIG. 1 is a circuit block diagram showing a configuration of an uninterruptible power supply system according to a first embodiment of the present disclosure.

FIG. 1 is a circuit block diagram showing a configuration of an uninterruptible power supply system according to a first embodiment of the present disclosure. In FIG. 1, this uninterruptible power supply system includes N uninterruptible power supply devices U1 to UN, N sets of circuit breakers B1 to B3, and a communication cable 1. It is noted that N is a natural number greater than or equal to 2, and N=6 in the example shown in FIG. 1.

Each uninterruptible power supply device U includes an input terminal T1, a DC terminal T2, an output terminal T3, and a communication terminal T4. Uninterruptible power supply devices U1 to U6 may be collectively referred to as "uninterruptible power supply device U" in the present specification. Six sets of circuit breakers B1 to B3 are provided to correspond to six uninterruptible power supply devices U1 to U6, respectively.

Input terminal T1 of each uninterruptible power supply device U is connected to a commercial AC power supply 71 through circuit breaker B1 of a corresponding set. Commercial AC power supply 71 supplies AC power of a commercial frequency to the uninterruptible power supply system.

DC terminal T2 of each uninterruptible power supply device U is connected to a battery 72 through circuit breaker B2 of a corresponding set. Battery 72 stores DC power. A capacitor may be connected instead of battery 72. Output terminal T3 of each uninterruptible power supply device U is connected to a load 73 through circuit breaker B3 of a corresponding set. Load 73 is driven by AC power supplied from the uninterruptible power supply system.

Circuit breakers B1 to B3 are turned on when corresponding uninterruptible power supply device U is used, and are turned off when corresponding uninterruptible power supply device U is electrically disconnected from the other uninterruptible power supply devices U. When uninterruptible power supply device U6 fails, for example, its corresponding circuit breakers B1 to B3 are turned off to electrically disconnect uninterruptible power supply device U6 from the other uninterruptible power supply devices U1 to U5.

As a result, it is possible to repair or replace failed uninterruptible power supply device U6 with a new uninterruptible power supply device while operating the other uninterruptible power supply devices U1 to U5. Such a function is referred to as a hot swap function. An insertion plug and an outlet may be used instead of each of circuit breakers B1 to B3.

Communication terminal T4 of each uninterruptible power supply device U is connected to communication terminals T4 of the other uninterruptible power supply devices U through communication cable 1. Each uninterruptible power supply device U provides and receives various pieces of information to and from the other uninterruptible power supply devices U through communication cable 1. Based on that information, of six uninterruptible power supply devices U1 to U6, M uninterruptible power supply devices U that are required to operate load 73 are selected. It is noted that M is a natural number greater than or equal to N, and is five, for example. In addition, uninterruptible power supply devices U to be selected are changed, in a predetermined cycle, such that operating times of six uninterruptible power supply devices U1 to U6 become equal.

Selected uninterruptible power supply device U performs an operating action of supplying power to load 73. During the operating action, when AC power is normally supplied from commercial AC power supply 71 (in a normal state of commercial AC power supply 71), uninterruptible power supply device U first converts the AC power from commercial AC power supply 71 into DC power, converts the DC power into AC power, and supplies the AC power to load 73 and stores the AC power in battery 72.

During the operating action, when AC power is not normally supplied from commercial AC power supply 71 (at the time of a power failure of commercial AC power supply 71), uninterruptible power supply device U converts the DC power in battery 72 into AC power and supplies the AC power to load 73. Therefore, even when a power failure occurs, the operation of load 73 can be continued during a time period in which the DC power is stored in battery 72.

Uninterruptible power supply device U that was not selected to operate load 73 performs a standby action of standing by without supplying power to load 73. During the standby action, when the operating time of uninterruptible power supply device U reaches a predetermined amount of time, this uninterruptible power supply device U performs a diagnostic action of diagnosing whether or not a predetermined part of this uninterruptible power supply device U has a failure.

When uninterruptible power supply device U diagnoses that the predetermined part of this uninterruptible power supply device U has a failure as a result of performing the diagnostic action, this uninterruptible power supply device U notifies a user of the uninterruptible power supply system to that effect. The user of the uninterruptible power supply system turns off circuit breakers B1 to B3 corresponding to failed uninterruptible power supply device U, and repairs or replaces failed uninterruptible power supply device U with a new uninterruptible power supply device while driving load 73.

Figure 2:
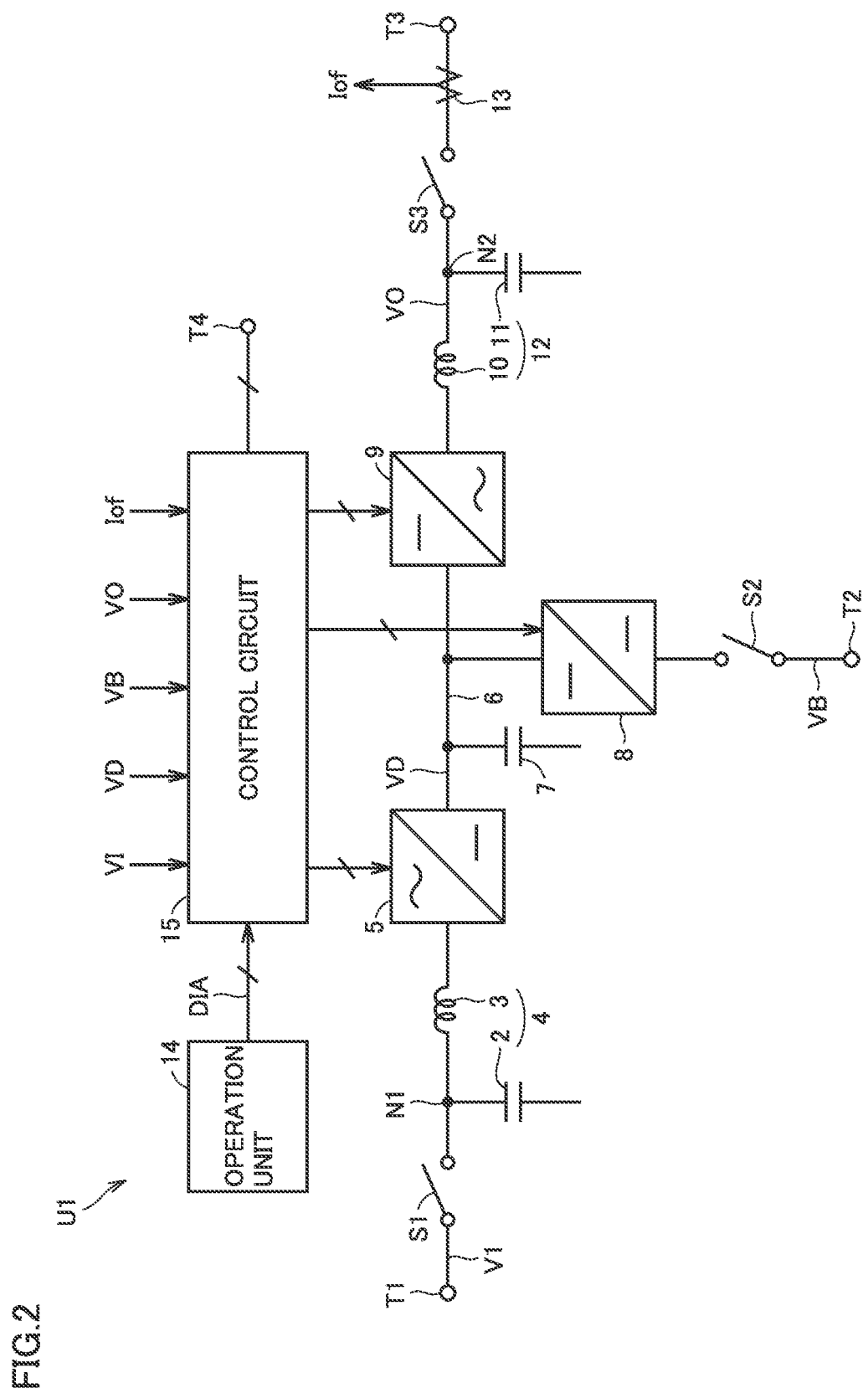
FIG. 2 is a circuit block diagram showing a configuration of an uninterruptible power supply device shown in FIG. 1.

FIG. 2 is a circuit block diagram showing a configuration of uninterruptible power supply device U1. In FIG. 2, this uninterruptible power supply device U1 includes switches S1 to S3, capacitors 2, 7 and 11, reactors 3 and 10, a converter 5, a DC line 6, a bidirectional chopper 8, an inverter 9, a current detector 13, an operation unit 14, and a control circuit 15.

Switch S1 and reactor 3 are connected in series between input terminal T1 and an AC node of converter 5. Capacitor 2 is connected to a node N1 between switch S1 and reactor 3. Switch S1 is turned on during the operating action, turned off during the standby action, and turned on or off during the diagnostic action. An instantaneous value of an AC input voltage VI that appears at input terminal T1 is detected by control circuit 15. A determination is made, such as whether or not a power failure has occurred, based on the instantaneous value of AC input voltage VI.

Capacitor 2 and reactor 3 form an AC filter 4. AC filter 4 is a low-pass filter, which allows AC power of a commercial frequency to pass through converter 5 from commercial AC power supply 71, and prevents a signal of a switching frequency generated at converter 5 from passing through commercial AC power supply 71. In other words, AC filter 4 converts a voltage pulse train output from the AC node of converter 5 into a sinusoidal AC voltage, and outputs the AC voltage to node N1.

Converter 5 is controlled by control circuit 15. In the normal state of commercial AC power supply 71 during the operating action, converter 5 converts the AC power supplied from commercial AC power supply 71 into DC power and outputs the DC power to DC line 6. At the time of a power failure of commercial AC power supply 71 during the operating action, the operation of converter 5 is stopped. During the standby action, the operation of converter 5 is stopped. During the diagnostic action, converter 5 is put into an operating state or a standby state. AC filter 4 and converter 5 form a "first power converter" that converts AC power into DC power.

Capacitor 7 is connected to DC line 6, and smooths a voltage VD on DC line 6. An instantaneous value of DC voltage VD that appears on DC line 6 is detected by control circuit 15. DC line 6 is connected to a high-voltage side node of bidirectional chopper 8, while a low-voltage side node of bidirectional chopper 8 is connected to DC terminal T2 through switch S2.

Switch S2 is turned on during the operating action, turned off during the standby action, and turned on or off during the diagnostic action. An instantaneous value of a terminal-to-terminal voltage VB of battery 72 that appears at DC terminal T2 is detected by control circuit 15.

Bidirectional chopper 8 is controlled by control circuit 15. In the normal state of commercial AC power supply 71 during the operating action, bidirectional chopper 8 stores the DC power supplied from converter 5 through DC line 6 in battery 72.

At the time of a power failure of commercial AC power supply 71 during the operating action, bidirectional chopper 8 supplies the DC power in battery 72 to inverter 9 through DC line 6. During the diagnostic action, bidirectional chopper 8 is put into the operating state or the standby state. Bidirectional chopper 8 forms a "second power converter" that provides and receives DC power between DC line 6 and battery 72.

Inverter 9 is controlled by control circuit 15. In the normal state of commercial AC power supply 71 during the operating action, inverter 9 converts the DC power supplied from converter 5 through DC line 6 into AC power. At the time of a power failure of commercial AC power supply 71 during the operating action, inverter 9 converts the DC power supplied from battery 72 through bidirectional chopper 8 into AC power.

An AC node of inverter 9 is connected to one terminal of reactor 10, while the other terminal (node N2) of reactor 10 is connected to output terminal T3 through switch S3. Capacitor 11 is connected to node N2. Reactor 10 and capacitor 11 form an AC filter 12.

AC filter 12 is a low-pass filter, which allows AC power of a commercial frequency generated at inverter 9 to pass through output terminal T3, and prevents a signal of a switching frequency generated at inverter 9 from passing through output terminal T3. In other words, AC filter 12 converts a voltage pulse train output from the AC node of inverter 9 into a sinusoidal AC voltage VO, and outputs AC voltage VO to node N2.

Switch S3 is controlled by control circuit 15, and is turned on during the operating action, turned off during the standby action, and turned off during the diagnostic action. An instantaneous value of AC output voltage VO that appears at node N2 is detected by control circuit 15. Current detector 13 detects an instantaneous value of a current Io flowing from node N2 to output terminal T3 (namely, load 73) through switch S3, and provides a signal Iof indicating the detected value to control circuit 15.

Operation unit 14 includes a plurality of buttons that are operated by the user of the uninterruptible power supply system, an image display unit for displaying various pieces of information, and the like. By operating operation unit 14, the user of the system can manually or automatically operate uninterruptible power supply device U1. By operating operation unit 14, the user of the system can also set a device number (No. 1 in this case) of uninterruptible power supply device U1 and the like. Operation unit 14 outputs a signal D1A including the set device number to control circuit 15.

Based on the signal from operation unit 14, AC input voltage VI, DC voltage VD, battery voltage VB, AC output voltage VO, AC output current Io and the like, control circuit 15 controls corresponding uninterruptible power supply device U1 as a whole.

Control circuit 15 is also connected to control circuits 15 of the other uninterruptible power supply devices U by communication cable 1, and provides and receives various pieces of information to and from the other uninterruptible power supply devices U through communication cable 1. Based on that information and the like, control circuit 15 performs the operating action, the standby action, or the diagnostic action.

Figure 3:
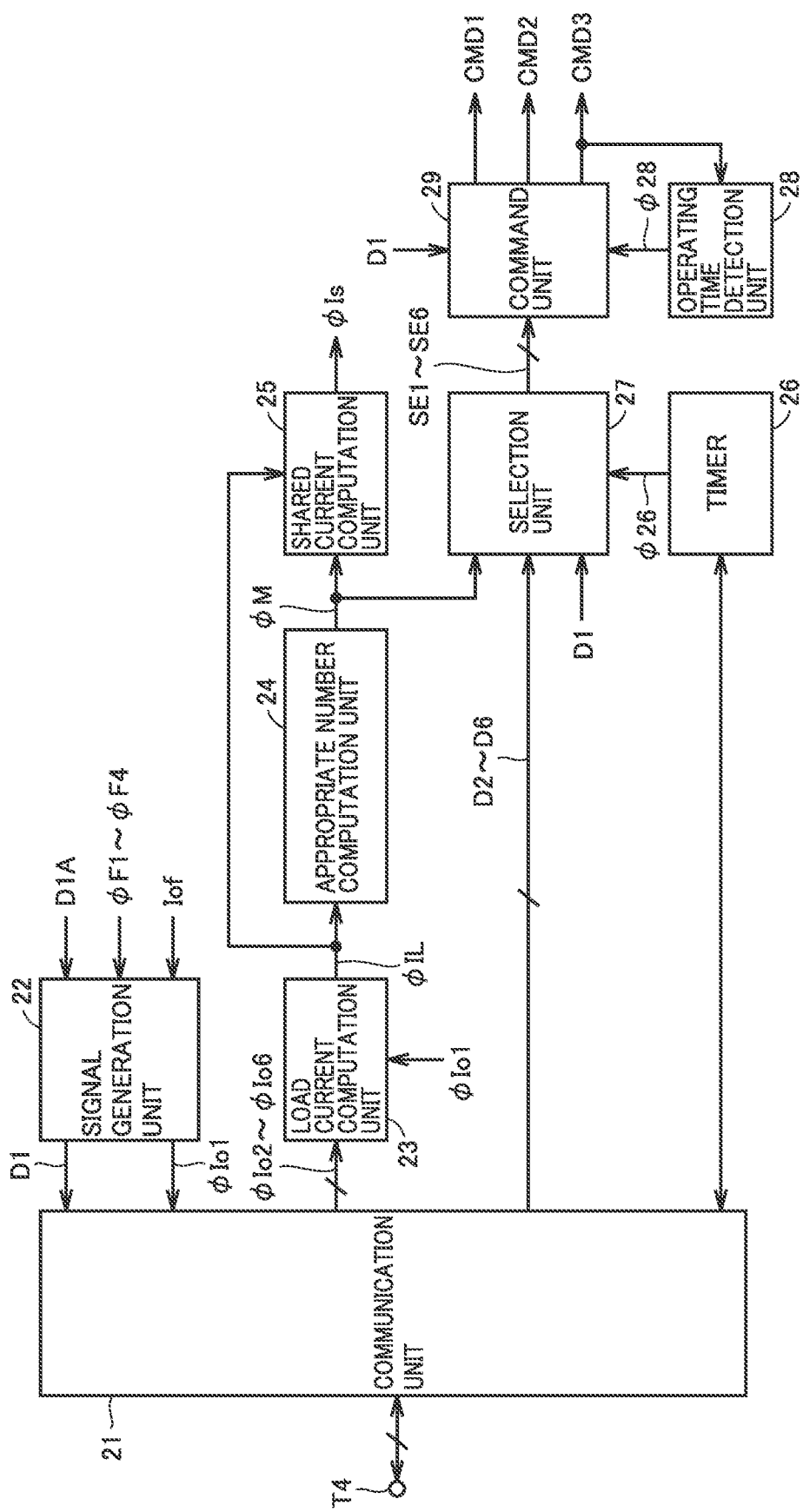
FIG. 3 is a block diagram showing a part of a control circuit shown in FIG. 2.

FIG. 3 is a block diagram showing a part of control circuit 15. In FIG. 3, control circuit 15 includes a communication unit 21, a signal generation unit 22, a load current computation unit 23, an appropriate number computation unit 24, a shared current computation unit 25, a timer 26, a selection unit 27, an operating time detection unit 28, and a command unit 29.

In the present specification, when viewed from control circuit 15, an uninterruptible power supply device including this control circuit 15 (U1 in this case) may be referred to as a "corresponding device," and uninterruptible power supply devices not including this control circuit 15 (U2 to U6 in this case) may be referred to as "other devices."

Communication unit 21 provides and receives various signals between corresponding device U1 and each of the other devices U2 to U6 through communication terminal T4 and communication cable 1. Signal generation unit 22 receives signal D1A from operation unit 14 (FIG. 2), failure detection signals $\phi$F1 to $\phi$F4 (FIG. 6), and signal Iof output from current detector 13.

Failure detection signal $\phi$F1 is a signal that is set to an "L" level, which is a deactivation level, when corresponding device U1 normally operates during the operating action, and is set to an "H" level, which is an activation level, when it is determined that corresponding device U1 has failed.

Failure detection signal $\phi$F2 is a signal that is set to the "L" level, which is a deactivation level, when converter 5 is diagnosed as not having a failure during the diagnostic action, and is set to the "H" level, which is an activation level, when converter 5 is diagnosed as having a failure.

Failure detection signal $\phi$F3 is a signal that is set to the "L" level, which is a deactivation level, when bidirectional chopper 8 is diagnosed as not having a failure during the diagnostic action, and is set to the "H" level, which is an activation level, when bidirectional chopper 8 is diagnosed as having a failure.

Failure detection signal $\phi$F4 is a signal that is set to the "L" level, which is a deactivation level, when inverter 9 is diagnosed as not having a failure during the diagnostic action, and is set to the "H" level, which is an activation level, when inverter 9 is diagnosed as having a failure.

When failure detection signals $\phi$F1 to $\phi$F4 are all at the "L" level, signal generation unit 22 generates signals D1 and $\phi$Io1 based on signal D1A. Signal D1 is a signal indicating that uninterruptible power supply device U1 with a device number "1" is included in the uninterruptible power supply system. Signal $\phi$Io1 is a signal indicating current Io output from uninterruptible power supply device U1 with the device number "1." Signals D1 and $\phi$Io1 are transmitted to control circuits 15 of the other devices U2 to U6 by communication unit 21.

When at least one of failure detection signals $\phi$F1 to $\phi$F4 is at the "H" level, signal generation unit 22 does not generate signals D1 and $\phi$Io1. In this case, uninterruptible power supply device U1 is not included in the uninterruptible power supply system, and is not selected as uninterruptible power supply device U that supplies power to load 73.

Load current computation unit 23 receives signal φIo1 output from signal generation unit 22, and signals φIo2 to φIo6 from control circuits 15 of the other devices U2 to U6 that have been received by communication unit 21. Signals φIo1 to φIo6 indicate AC output currents Io from uninterruptible power supply devices U1 to U6, respectively. Load current computation unit 23 sums AC output currents Io from uninterruptible power supply devices U1 to U6 indicated by signals φIo1 to φIo6 to determine a load current IL, and outputs a signal φIL indicating load current IL.

Appropriate number computation unit 24 determines an appropriate number M of operating uninterruptible power supply devices U that are required to supply load current IL indicated by signal φIL, and outputs a signal φM indicating that number M. The efficiency of uninterruptible power supply device U is highest when its AC output current Io has a predetermined value, and decreases as the difference between its AC output current Io and the predetermined value increases. Appropriate number computation unit 24 determines appropriate number M of operating uninterruptible power supply devices such that the uninterruptible power supply system has the highest efficiency.

Shared current computation unit 25 divides load current IL, which is indicated by signal φIL output from load current computation unit 23, by appropriate number M of operating uninterruptible power supply devices, which is indicated by signal φM output from appropriate number computation unit 24, to determine a shared current Is=IL/M of corresponding device U1, and outputs a signal φIs indicating shared current Is.

Timer 26 is coupled to timers 26 of the other devices U2 to U6 through communication unit 21, and operates in synchronization with timers 26 of the other devices U2 to U6. Every time a predetermined amount of time (for example, one week) elapses, timer 26 raises a signal φ26 to the "H" level for a predetermined amount of time.

Selection unit 27 receives signal D1 generated by signal generation unit 22, signals D2 to D6 from control circuits 15 of the other devices U2 to U6 that have been received by communication unit 21, signal φM output from appropriate number computation unit 24, and signal φ26 output from timer 26, and outputs signals SE1 to SE6.

Signal D1 is a signal generated by signal generation unit 22 of uninterruptible power supply device U1. Signals D2 to D6 are signals generated by signal generation units 22 of uninterruptible power supply devices U2 to U6, respectively, and received by communication unit 21 of uninterruptible power supply device U1. Signals D1 to D6 indicate that six uninterruptible power supply devices U1 to U6 are included in this uninterruptible power supply system.

When uninterruptible power supply device U6 fails and signal D6 is not received, for example, selection unit 27 outputs signals SE1 to SE5 and does not output signal SE6.

Appropriate number M of operating uninterruptible power supply devices indicated by signal φM indicates the number of uninterruptible power supply devices U that are required to supply power to load 73. It is noted that M is five, for example. Signals SE1 to SE6 correspond to uninterruptible power supply devices U1 to U6, respectively. When signals SE1 to SE6 are set to the "H" level, which is a selection level, uninterruptible power supply devices U1 to U6 are selected, respectively. When signals SE1 to SE6 are set to the "L" level, which is a deselection level, uninterruptible power supply devices U1 to U6 are not selected, respectively.

Selection unit 27 sets, of signals SE1 to SE6, number M (for example, five) of signals (for example, SE1 to SE5) indicated by signal φM to the "H" level, which is a selection level, and sets the remaining signal (SE6 in this case) to the "L" level, which is a deselection level.

Signals SE1 to SE6 may be collectively referred to as "signal SE" in the present specification. When signal SE is set to the "H" level, which is a selection level, uninterruptible power supply device U corresponding to this signal SE performs the operating action.

In response to signal φ26 output from timer 26 being raised to the "H" level, selection unit 27 changes signals SE to be set to the selection level, such that uninterruptible power supply devices U1 to U6 have an equal operating time.

Figure 4:
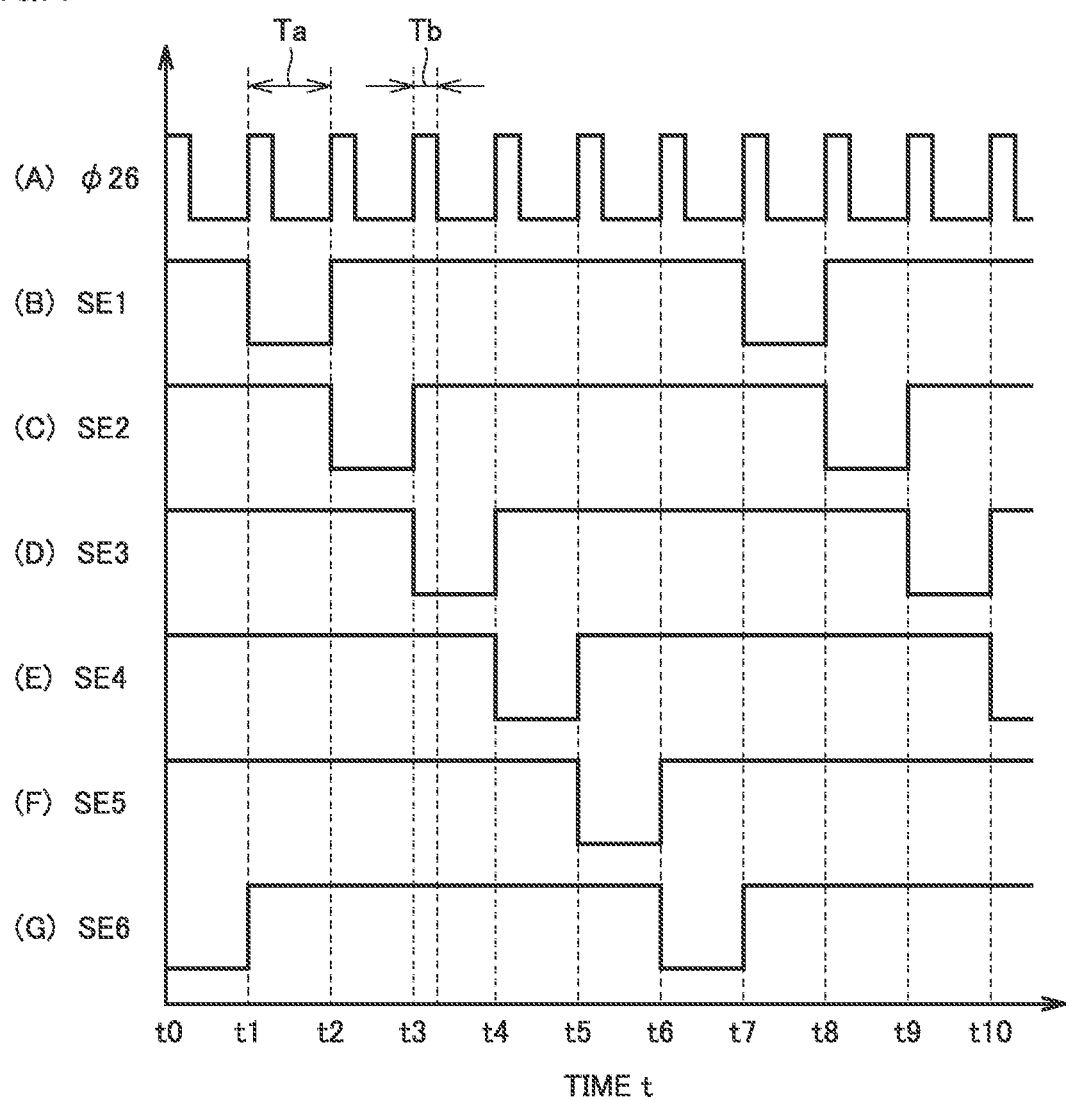
FIG. 4 is a time chart showing an operation of a selection unit shown in FIG. 3.

FIG. 4 is a time chart illustrating the operation of selection unit 27. In FIG. 4, (A) shows a waveform of signal φ26, and (B) to (G) show waveforms of signals SE1 to SE6. Every time a predetermined amount of time Ta elapses, signal φ26 is raised from the "L" level to the "H" level for a defined amount of time Tb, where Tb<Ta. In FIG. 4, signal φ26 is raised to the "H" level for defined amount of time Tb at each of times t0 to t10.

At time t0, in response to a rising edge of signal φ26, signals SE1 to SE5 are set to the "H" level, and signal SE6 is set to the "L" level. Then, at time t1, in response to a rising edge of signal φ26, signals SE2 to SE6 are set to the "H" level, and signal SE1 is set to the "L" level. Then, at time t2, in response to a rising edge of signal φ26, signals SE3 to SE6 and SE1 are set to the "H" level, and signal SE2 is set to the "L" level.

Likewise, every time signal φ26 is set to the "H" level, signals SE1 to SE6 are sequentially set to the "L" level one by one. Thus, the times during which signals SE1 to SE6 are set to the "H" level, which is a selection level, become equal, and consequently, the operating times of uninterruptible power supply devices U1 to U6 become equal.

Referring again to FIG. 3, operating time detection unit 28 detects an operating time of corresponding device U1, and raises a signal φ28 from the "L" level to the "H" level in response to the detected operating time reaching a predetermined amount of time Tc (for example, one year). Operating time detection unit 28 is reset in response to a rising edge of a diagnosis command signal CMD3, and redetects the operating time of corresponding device U1 from zero. Diagnosis command signal CMD3 will be described later.

Command unit 29 receives signal D1 output from signal generation unit 22, signals SE1 to SE6 output from selection unit 27, and signal φ28 output from operating time detection unit 28, and outputs an operation command signal CMD1, a standby command signal CMD2, and diagnosis command signal CMD3.

When signal SE1 corresponding to corresponding device U1 indicated by signal D1 is at the "H" level, command unit 29 sets operation command signal CMD1 to the "H" level, which is an activation level, to cause corresponding device U1 to perform the operating action.

When signal SE1 is at the "L" level, command unit 29 sets standby command signal CMD2 to the "H" level, which is an activation level, to cause corresponding device U1 to perform the standby action.

Furthermore, when signal φ28 output from operating time detection unit 28 is set to the "H" level when standby command signal CMD2 is at the "H" level, command unit 29 sets diagnosis command signal CMD3 to the "H" level for a predetermined amount of time, to cause corresponding device U1 to perform the diagnostic action.

Figure 5:
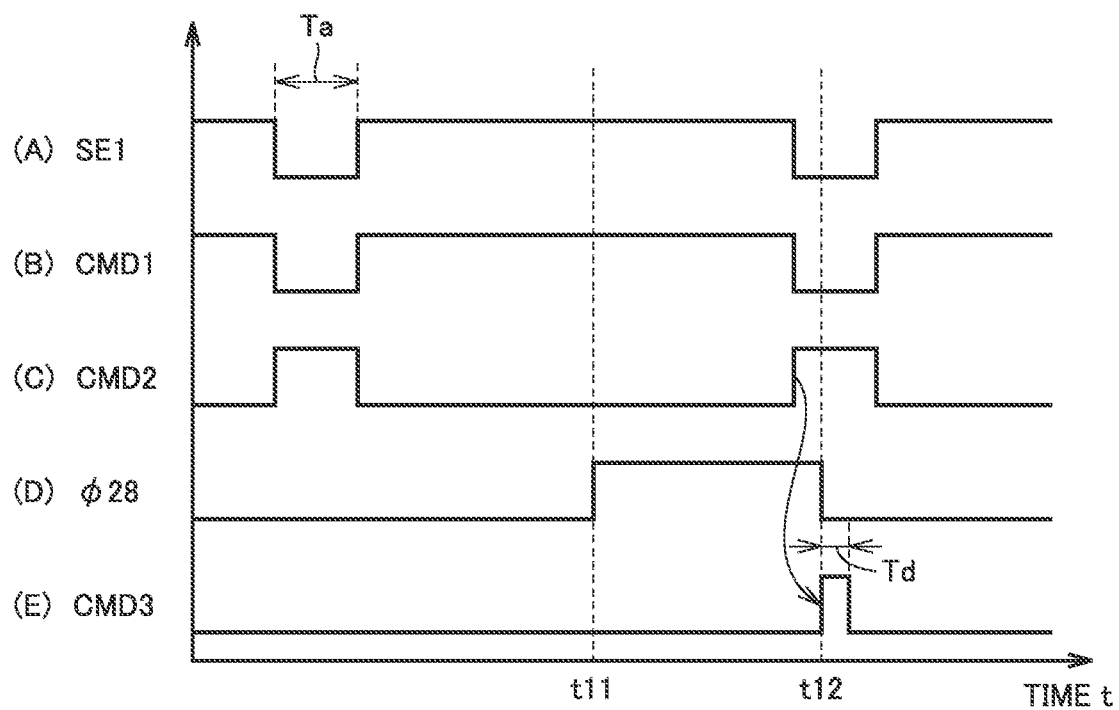
FIG. 5 is a time chart showing an operation of a command unit shown in FIG. 3.

FIG. 5 is a time chart illustrating the operation of command unit 29. In FIG. 5, (A) to (E) show waveforms of signals SE1, CMD1, CMD2, ϕ28 and CMD3, respectively.

FIG. 5 shows an example where the operating time of corresponding device U1 reaches predetermined amount of time Tc (for example, one year) at a certain time t11, and signal ϕ28 output from operating time detection unit 28 is raised from the "L" level to the "H" level. Signal SE1 is lowered from the "H" level to the "L" level for predetermined amount of time Ta (for example, one week) in a predetermined cycle.

During a time period in which signal SE1 is set to the "H" level, which is a selection level, operation command signal CMD1 is set to the "H" level, which is an activation level, and standby command signal CMD2 is set to the "L" level, which is a deactivation level.

Conversely, during a time period in which signal SE1 is set to the "L" level, which is a deselection level, operation command signal CMD1 is set to the "L" level, which is a deactivation level, and standby command signal CMD2 is set to the "H" level, which is an activation level.

If signal ϕ28 output from operating time detection unit 28 is at the "H" level during a rising edge of standby command signal CMD2, diagnosis command signal CMD3 is raised from the "L" level to the "H" level for a predetermined amount of time Td (time t12), where Td<Ta. When diagnosis command signal CMD3 is raised from the "L" level to the "H" level, operating time detection unit 28 is reset and signal ϕ28 is lowered from the "H" level to the "L" level.

Figure 6:
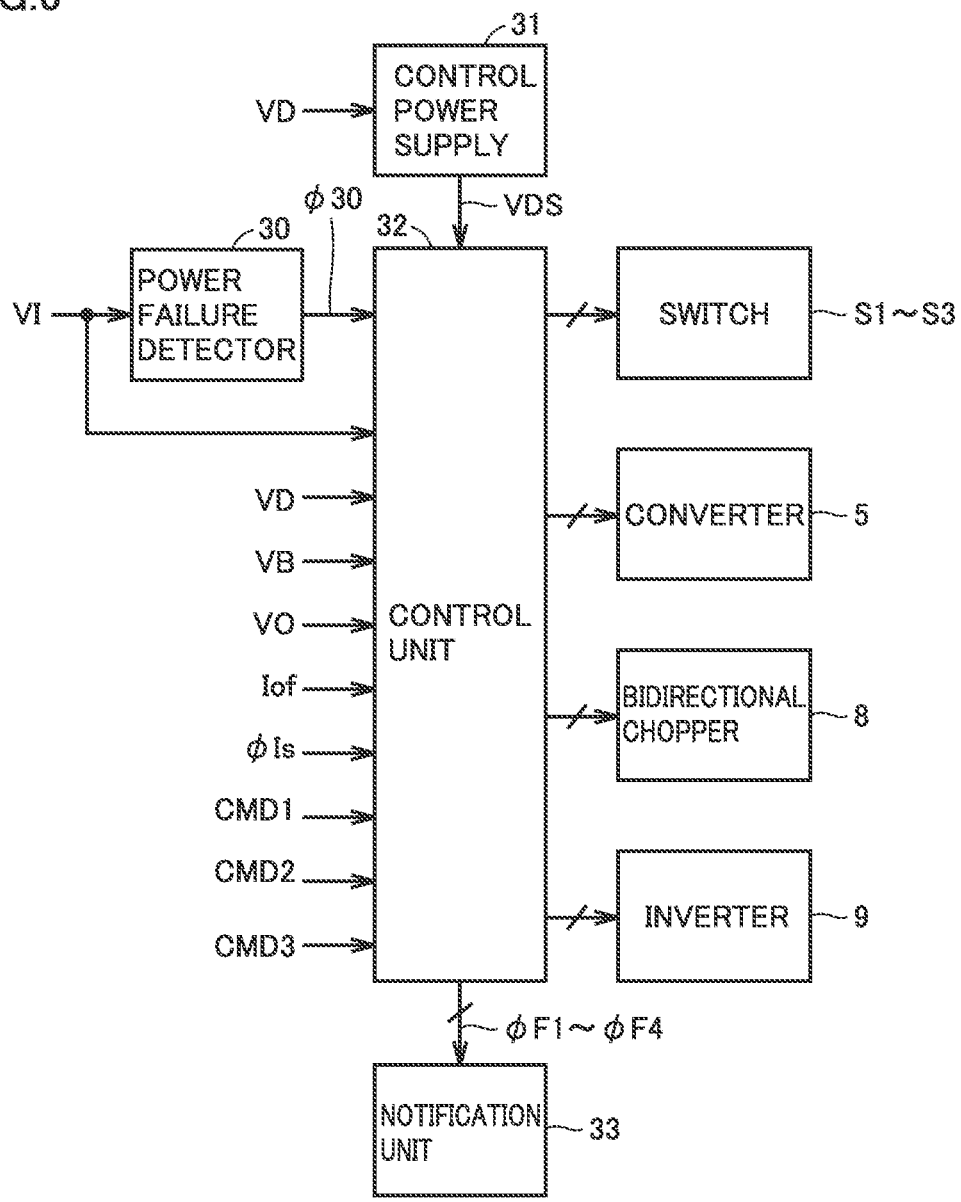
FIG. 6 is a block diagram showing another part of the control circuit shown in FIG. 2.

FIG. 6 is a block diagram showing a configuration of another part of control circuit 15 (FIG. 2). In FIG. 6, control circuit 15 includes a power failure detector 30, a control power supply 31, a control unit 32, and a notification unit 33.

Power failure detector 30 detects whether or not a power failure of commercial AC power supply 71 has occurred based on AC input voltage VI, and outputs a signal π30 indicating the detection result. For example, power failure detector 30 determines that commercial AC power supply 71 is normal when AC input voltage VI is higher than a lower limit value, and determines that a power failure of commercial AC power supply 71 has occurred when AC input voltage VI falls below the lower limit value.

When commercial AC power supply 71 is normal, power failure detection signal ϕ30 is set to the "H" level, which is a deactivation level. When a power failure of commercial AC power supply 71 occurs, power failure detection signal ϕ30 is set to the "L" level, which is an activation level.

Control power supply 31 generates a power supply voltage VDS for control unit 32 based on DC voltage VD. Control unit 32 is driven by power supply voltage VDS, controls switches S1 to S3, converter 5, bidirectional chopper 8, and inverter 9 of corresponding device U1 (FIG. 2) based on power failure detection signal ϕ30, AC input voltage VI, AC output voltage VO, DC voltage VD, battery voltage VB, signal Iof output from current detector 13 (FIG. 2), signal ϕIs output from shared current computation unit 25 (FIG. 3), and signals CMD1 to CMD3 output from command unit 29 (FIG. 3), and outputs failure detection signals ϕF1 to ϕF4.

When operation command signal CMD1 is at the "H" level, control unit 32 performs the operating action. During the operating action, when power failure detection signal ϕ30 is at the "H" level, which is a deactivation level (in the normal state of commercial AC power supply 71), control unit 32 turns on switches S1 to S3, and operates converter 5, bidirectional chopper 8, and inverter 9.

When switches S1 to S3 are turned on, AC power is supplied from commercial AC power supply 71 to converter 5 through switch S1 and AC filter 4, the low-voltage side node of bidirectional chopper 8 is connected to battery 72 through switch S2, and inverter 9 is connected to load 73 through AC filter 12 and switch S3.

Converter 5 converts the AC power supplied from commercial AC power supply 71 through switch S1 and AC filter 4 into DC power, and outputs the DC power to DC line 6. Bidirectional chopper 8 stores the DC power supplied from converter 5 through DC line 6 in battery 72 through switch S2. Inverter 9 converts the DC power supplied from converter 5 through DC line 6 into AC power, and supplies the AC power to load 73 through AC filter 12 and switch S3.

At this time, control unit 32 controls converter 5 such that DC voltage VD on DC line 6 becomes equal to a desired target voltage VDT, controls bidirectional chopper 8 such that battery voltage VB becomes equal to a desired target battery voltage VBT, and controls inverter 9 such that AC output current Io becomes equal to shared current Is.

During the operating action, when power failure detection signal ϕ30 is set to the "L" level, which is an activation level, that is, when a power failure of commercial AC power supply 71 occurs, control unit 32 turns off switch S1, and stops the operation of converter 5. As a result, commercial AC power supply 71 and DC line 6 are electrically disconnected from each other.

Bidirectional chopper 8 supplies the DC power supplied from battery 72 through switch S2 to inverter 9 through DC line 6. Inverter 9 converts the DC power supplied from battery 72 through switch S2, bidirectional chopper 8, and DC line 6 into AC power, and supplies the AC power to load 73 through AC filter 12 and switch S3.

At this time, control unit 32 controls bidirectional chopper 8 such that DC voltage VD on DC line 6 becomes equal to desired target voltage VDT, and controls inverter 9 such that AC output current Io becomes equal to shared current Is.

During the operating action, when DC voltage VD, AC output current Io or the like reaches an abnormal value, control unit 32 determines that corresponding device U1 has failed, then raises failure detection signal ϕF1 from the "L" level to the "H" level, and turns off switches S1 to S3 to stop the operation of converter 5, bidirectional chopper 8, and inverter 9. When signal ϕF1 is set to the "H" level, notification unit 33 notifies the user of the uninterruptible power supply system that corresponding device U1 has a failure by means of sound, light, text and the like. In this first embodiment, however, the possibility of uninterruptible power supply device U failing during the operating action is low because it is periodically diagnosed whether or not uninterruptible power supply device U has a failure.

When standby command signal CMD2 is at the "H" level, control unit 32 performs the standby action. During the standby action, control unit 32 turns off switches S1 to S3, and stops the operation of converter 5, bidirectional chopper 8, and inverter 9.

When switch S1 is turned off, converter 5 is electrically disconnected from commercial AC power supply 71. When switch S2 is turned off, bidirectional chopper 8 is electrically disconnected from battery 72. When switch S3 is turned off, inverter 9 is electrically disconnected from load 73.

During the standby action, when diagnosis command signal CMD3 is set to the "H" level, and power failure detection signal ϕ30 is at the "H" level, which is a deactivation level, control unit 32 performs the diagnostic action.

During the diagnostic action, control unit 32 sequentially diagnoses converter 5, bidirectional chopper 8, and inverter 9. When diagnosing converter 5, control unit 32 sets DC voltage VD to a reference voltage, and turns on switch S1 to operate converter 5. When switch S1 is turned on to operate converter 5, DC voltage VD increases. Control unit 32 diagnoses whether or not converter 5 has a failure based on a temporal variation in DC voltage VD, and outputs signal ϕF2 indicating the diagnostic result.

Signal ϕF2 is set to the "L" level, which is a deactivation level, when converter 5 is diagnosed as not having have a failure, and signal ϕF2 is set to the "H" level, which is an activation level, when converter 5 is diagnosed as having a failure. When signal ϕF2 is set to the "H" level, notification unit 33 notifies the user of the uninterruptible power supply system that converter 5 has a failure by means of sound, light, text and the like.

When diagnosing bidirectional chopper 8, control unit 32 sets DC voltage VD to an initial voltage, and turns on switch S2 to operate bidirectional chopper 8. When switch S2 is turned on to operate bidirectional chopper 8, DC voltage VD increases. Control unit 32 diagnoses whether or not bidirectional chopper 8 has a failure based on a temporal variation in DC voltage VD, and outputs signal ϕF3 indicating the diagnostic result.

Signal ϕF3 is set to the "L" level, which is a deactivation level, when bidirectional chopper 8 does not have a failure, and signal ϕF3 is set to the "H" level, which is an activation level, when bidirectional chopper 8 has a failure. When signal ϕF3 is set to the "H" level, notification unit 33 notifies the user of the uninterruptible power supply system that bidirectional chopper 8 has a failure by means of sound, light, text and the like.

When diagnosing inverter 9, control unit 32 sets DC voltage VD to a predetermined voltage and operates inverter 9. When inverter 9 is operated, DC voltage VD decreases. Control unit 32 diagnoses whether or not inverter 9 has a failure based on a temporal variation in DC voltage VD, and outputs signal ϕF4 indicating the diagnostic result.

Signal ϕF4 is set to the "L" level, which is a deactivation level, when inverter 9 does not have a failure, and signal ϕF4 is set to the "H" level, which is an activation level, when inverter 9 has a failure. When signal ϕF4 is set to the "H" level, notification unit 33 notifies the user of the uninterruptible power supply system that inverter 9 at least partially has a failure by means of sound, light, text and the like.

Upon being notified by notification unit 33 that converter 5, bidirectional chopper 8, or inverter 9 of corresponding device U1 has a failure, the user turns off circuit breakers B1 to B3 corresponding to uninterruptible power supply device U1 to electrically disconnect uninterruptible power supply device U1 from the other uninterruptible power supply devices U2 to U6. The user then repairs converter 5, bidirectional chopper 8, or inverter 9 of uninterruptible power supply device U1, or replaces uninterruptible power supply device U1 with a new uninterruptible power supply device U, and then turns on circuit breakers B1 to B3. As a result, uninterruptible power supply device U1 is re-integrated into the uninterruptible power supply system.

Since each of uninterruptible power supply devices U2 to U6 has a similar configuration to uninterruptible power supply device U1, description thereof will not be repeated.

Figure 7:
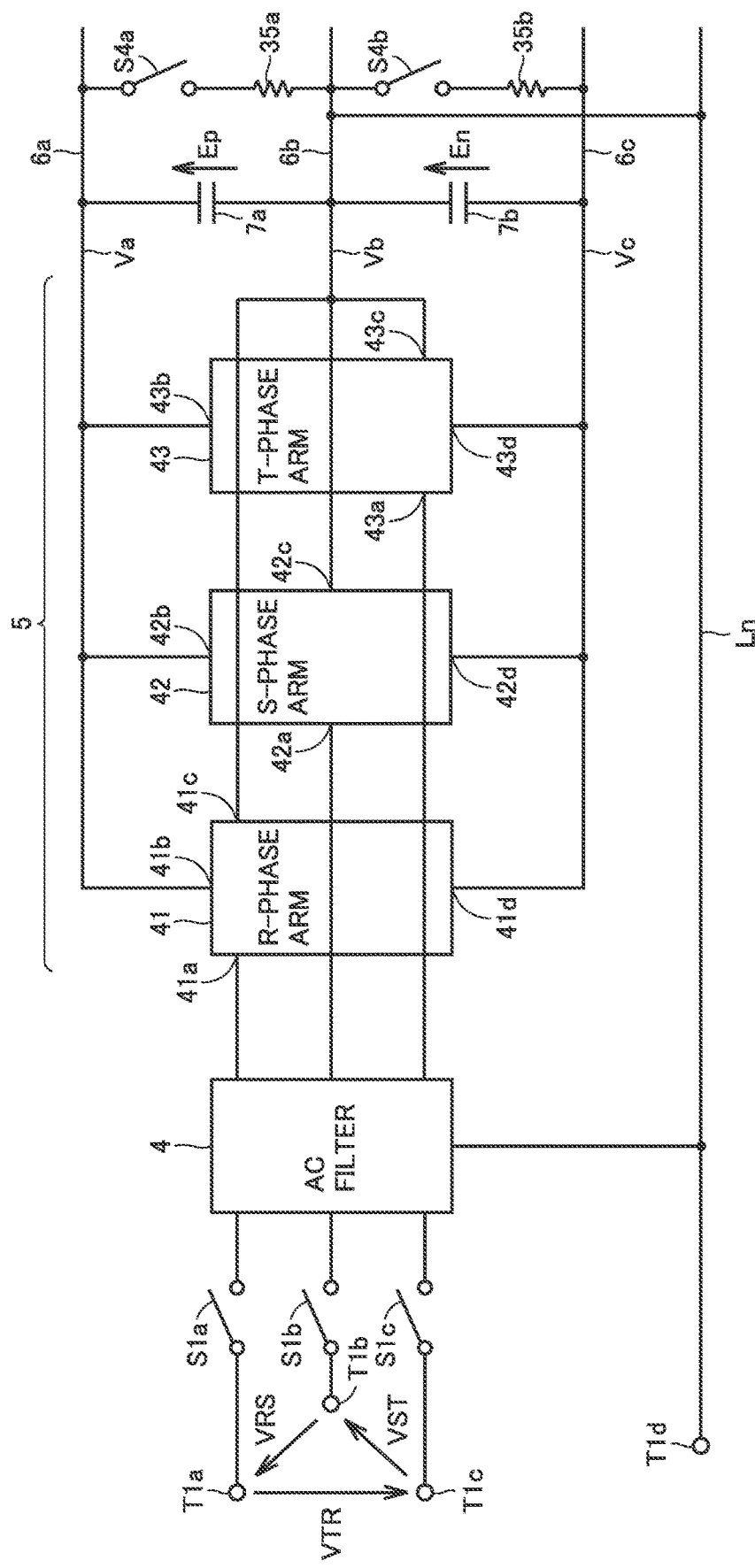
FIG. 7 is a circuit diagram showing a configuration of a converter shown in FIG. 2 and its peripheral portion in more detail.

Next, the failure diagnosis of converter 5 will be described in more detail. FIG. 7 is a circuit diagram showing a configuration of converter 5 and its peripheral portion of uninterruptible power supply device U1 in more detail. In FIG. 7, this uninterruptible power supply device U1 actually receives three-phase AC voltages VRS, VST and VTR from commercial AC power supply 71, and is connected to a neutral point of commercial AC power supply 71. Converter 5 also converts three-phase AC voltages VRS, VST and VTR into three-level DC voltages Va, Vb and Vc.

Thus, this uninterruptible power supply device U1 includes input terminals T1a to T1d, switches S1a to S1c, DC lines 6a to 6c, a neutral point line Ln, capacitors 7a and 7b, switches S4a and S4b, and resistive elements 35a and 35b.

AC voltage VRS is provided between input terminals T1a and T1b. AC voltage VST is provided between input terminals T1b and T1c. AC voltage VTR is provided between input terminals T1c and T1a. Input terminal T1d is connected to neutral point line Ln, and to the neutral point of commercial AC power supply 71. Instantaneous values of three-phase AC voltages VRS, VST and VTR are detected by control unit 32 (FIG. 6).

One terminals of switches S1a to S1c are connected to input terminals T1a to T1c, respectively. Switches S1a to S1c are controlled by control unit 32 in the same manner as switch S1 (FIG. 2).

AC filter 4 is provided between the other terminals of switches S1a to S1c and converter 5, and is connected to neutral point line Ln. AC filter 4 is a low-pass filter including a plurality of reactors and a plurality of capacitors.

AC filter 4 allows three-phase AC voltages VRS, VST and VTR of a commercial frequency supplied from commercial AC power supply 71 through switches S1a to S1c to pass through converter 5, and prevents a signal of a switching frequency generated at converter 5 from passing through the commercial AC power supply 71 side. The signal of a switching frequency generated at converter 5 flows out to neutral point line Ln through AC filter 4.

Converter 5 includes an R-phase arm 41, an S-phase arm 42, and a T-phase arm 43. R-phase arm 41 has an AC node 41a, a high-voltage node 41b, an intermediate-voltage node 41c, and a low-voltage node 41d. S-phase arm 42 has an AC node 42a, a high-voltage node 42b, an intermediate-voltage node 42c, and a low-voltage node 42d. T-phase arm 43 has an AC node 43a, a high-voltage node 43b, an intermediate-voltage node 43c, and a low-voltage node 43d.

AC nodes 41a to 41c of arms 41 to 43 are connected to the other terminals of switches S1a to S1c through AC filter 4, respectively. High-voltage nodes 41b to 43b of arms 41 to 43 are all connected to DC line 6a. Intermediate-voltage nodes 41c to 43c of arms 41 to 43 are all connected to DC line 6b. Low-voltage nodes 41d to 43d of arms 41 to 43 are all connected to DC line 6c.

Each of arms 41 to 43 is a well-known arm including a plurality of insulated gate bipolar transistor (IGBT) elements and a plurality of diodes. The turning on and off of each IGBT element is controlled by control unit 32 (FIG. 6).

Capacitor 7a is connected between DC lines 6a and 6b, and smooths a DC voltage Ep between DC lines 6a and 6b. Capacitor 7b is connected between DC lines 6b and 6c, and smooths a DC voltage En between DC lines 6b and 6c. Capacitor 7a and capacitor 7b have an equal capacity. The sum of DC voltages Ep and En is DC voltage VD (FIG. 2). In addition, Ep=Va−Vb, En=Vb−Vc, and Ep=En. DC line 6b is connected to neutral point line Ln. An instantaneous value of each of DC voltages Ep and En is detected by control unit 32.

Switch S4a and resistive element 35a are connected in series between DC lines 6a and 6b. Switch S4b and resistive element 35b are connected in series between DC lines 6b and 6c. Switches S4a and S4b are controlled by control unit 32, and are turned off normally and turned on when terminal-to-terminal voltages Ep and En of capacitors 7a and 7b are reset to 0 V during the diagnostic action.

When conducting a failure diagnosis of converter 5, control unit 32 first turns on switches S4a and S4b. When switch S4a is turned on, a current flows from one terminal of capacitor 7a to the other terminal of capacitor 7a through DC line 6a, switch S4a, resistive element 35a, and DC line 6b, and thus, capacitor 7a is discharged and terminal-to-terminal voltage Ep of capacitor 7a is reset to 0 V.

When switch S4b is turned on, a current flows from one terminal of capacitor 7b to the other terminal of capacitor 7b through DC line 6b, switch S4b, resistive element 35b, and DC line 6c, and thus, capacitor 7b is discharged and terminal-to-terminal voltage En of capacitor 7b is reset to 0 V. When DC voltages Ep and En are reset to 0 V, control unit 32 turns off switches S4a and S4b.

Control unit 32 then turns on switches S1a to S1c to perform preliminary charging of capacitors 7a and 7b. When switches S1a to S1c are turned on, three-phase AC voltages VRS, VST and VTR are supplied from commercial AC power supply 71 to converter 5 through switches S1a to S1c and AC filter 4. The plurality of diodes included in arms 41 to 43 of converter 5 form a three-phase full-wave rectifier circuit. Thus, capacitors 7a and 7b are preliminarily charged to a predetermined DC voltage V1.

When the preliminary charging is completed, control unit 32 starts the operation of converter 5. R-phase arm 41 receives DC voltages Va to Vc from DC lines 6a to 6c, and outputs a pulse width modulation (PWM) signal Vr from AC node 41a. S-phase arm 42 receives DC voltages Va to Vc from DC lines 6a to 6c, and outputs a PWM signal Vs from AC node 42a. T-phase arm 43 receives DC voltages Va to Vc from DC lines 6a to 6c, and outputs a PWM signal Vt from AC node 43a.

Each of PWM signals Vr, Vs and Vt is a signal that changes to DC voltage Va or DC voltage Vc at a predetermined switching frequency with intermediate voltage Vb as a reference voltage, and has a commercial frequency. PWM signals Vr, Vs and Vt have phases that are offset from one another by 120 degrees.

A PWM signal Vrs=Vr−Vs appears between AC nodes 41a and 42a of arms 41 and 42. A PWM signal Vst=Vs−Vt appears between AC nodes 42a and 43a of arms 42 and 43. A PWM signal Vtr=Vt−Vr appears between AC nodes 43a and 41a of arms 43 and 41.

PWM signals Vrs, Vst and Vts each have a commercial frequency, and have phases that are offset from one another by 120 degrees. PWM signals Vrs, Vst and Vts that have passed through AC filter 4 change to three-phase AC voltages VRSc, VSTc and VTSc.

When the phases of three-phase AC voltages VRSc, VSTc and VTSc are delayed from the phases of three-phase AC voltages VRS, VST and VTS, power is supplied from commercial AC power supply 71 to capacitors 7a and 7b through converter 5, causing terminal-to-terminal voltages Ep and En of capacitors 7a and 7b to increase.

When the phases of three-phase AC voltages VRSc, VSTc and VTSc are advanced from the phases of three-phase AC voltages VRS, VST and VTS, power is regenerated from capacitors 7a and 7b to commercial AC power supply 71 through converter 5, causing terminal-to-terminal voltages Ep and En of capacitors 7a and 7b to decrease.

During the diagnostic action, the phases of three-phase AC voltages VRSc, VSTc and VTSc are set to be delayed from the phases of three-phase AC voltages VRS, VST and VTS by a predetermined degree. Therefore, when the operation of converter 5 is started after the preliminary charging has been completed, terminal-to-terminal voltages Ep and En of capacitors 7a and 7b increase.

Control unit 32 detects each of terminal-to-terminal voltages Ep and En of capacitors 7a and 7b after a predetermined amount of time (for example, 5 ms) has elapsed since the turning on of switches S1a to S1c. Then, when the detected value of each of DC voltages Ep and En is within a normal range from V2 to V3, control unit 32 diagnoses converter 5 as not having a failure and sets failure detection signal φF2 to the "L" level, which is a deactivation level, and when the detected value is out of the normal range from V2 to V3, control unit 32 diagnoses converter 5 as at least partially having a failure and sets failure detection signal φF2 to the "H" level, which is an activation level.

When uninterruptible power supply device U1 is put into the operating state while converter 5 at least partially has a failure, uninterruptible power supply device U1 may fail, which in turn may cause the uninterruptible power supply system to fail. In this first embodiment, therefore, failure detection signal φF2 is set to the "H" level to notify the user of the system that converter 5 at least partially has a failure.

Figure 8:
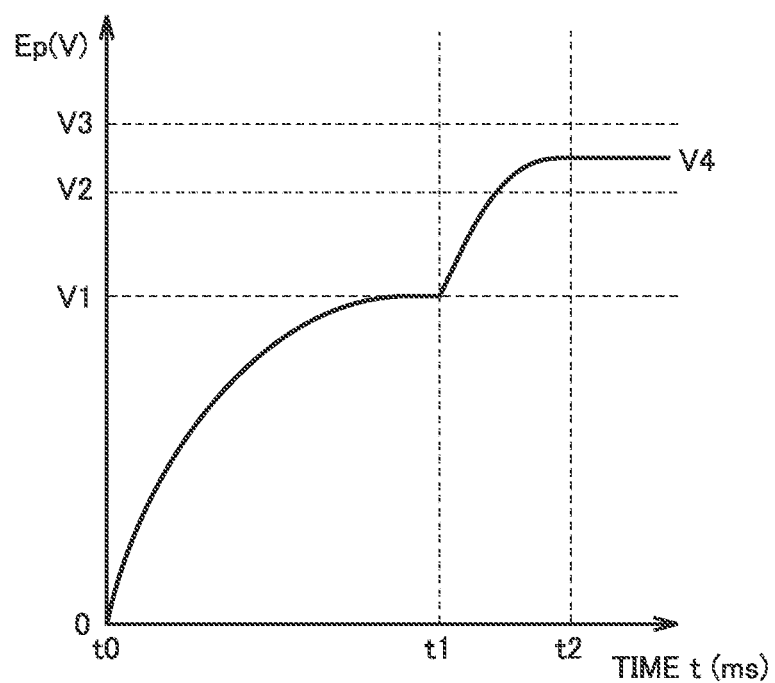
FIG. 8 is a time chart schematically showing a temporal variation in a DC voltage Ep shown in FIG. 7.

FIG. 8 is a time chart schematically showing a temporal variation in terminal-to-terminal voltage Ep of capacitor 7a. FIG. 8 shows an example where converter 5 does not have a failure. At time t0, switches S1a to S1c are turned on, causing DC voltage Ep to increase. At time t1, DC voltage Ep reaches predetermined initial voltage V1 and the preliminary charging is completed, and the operation of converter 5 is started. The operation of converter 5 causes DC voltage Ep to increase further. At time t2, DC voltage Ep is detected. Since the detected value of DC voltage Ep is V4, which is within the normal range from V2 to V3, converter 5 is diagnosed as not having a failure.

When one of three arms 41 to 43 has a failure, for example, the detected value of DC voltage Ep is lower than the normal range from V2 to V3, and converter 5 is diagnosed as at least partially having a failure.

It may alternatively be that each of terminal-to-terminal voltages Ep and En of capacitors 7a and 7b is detected at time t2 when a predetermined amount of time (for example, 2 ms) has elapsed since time t1 when the operation of converter 5 was started, and converter 5 is diagnosed as not having a failure when the detected value of each of DC voltages Ep and En is within the normal range from V2 to V3, and converter 5 is diagnosed as at least partially having a failure when the detected value is out of the normal range.

During the operating action, when power failure detection signal φ30 is at the "H" level (in the normal state of commercial AC power supply 71), control unit 32 adjusts the phase difference between three-phase AC voltages VRSc, VSTc, VTSc and three-phase AC voltages VRS, VST, VTS such that voltage VD=Ep+En which is the sum of DC voltages Ep and En becomes equal to target voltage VDT.

During the operating action, when power failure detection signal φ30 is set to the "L" level (at the time of a power failure of commercial AC power supply 71) and when corresponding device U1 fails, control unit 32 turns off switches S1a to S1c, and turns off all the IGBT elements of converter 5 to stop the operation of converter 5.

During the standby action, control unit 32 turns off switches S1a to S1c, and turns off all the IGBT elements of converter 5 to stop the operation of converter 5, as in the case of a power failure.

Figure 9:
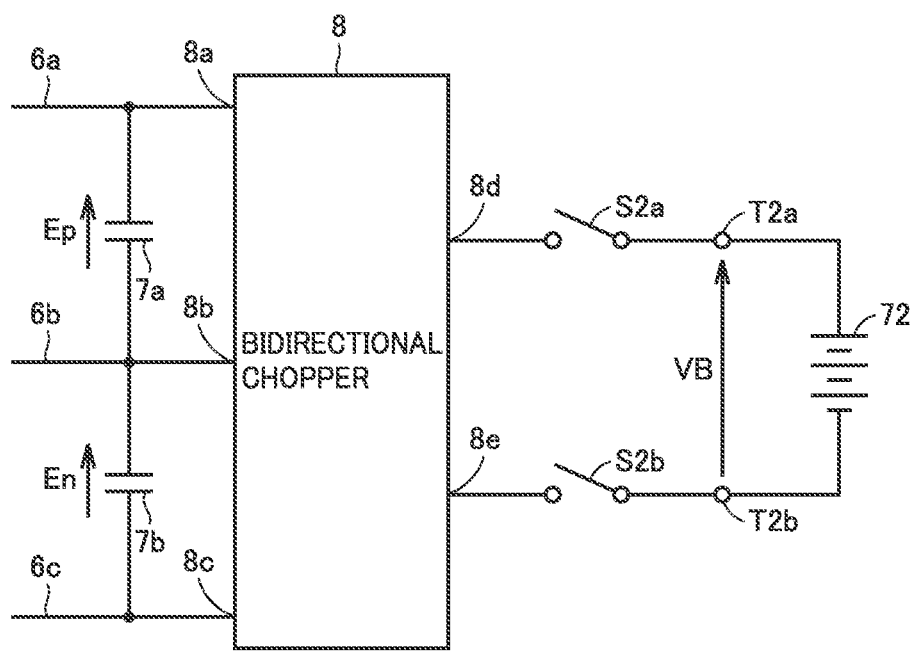
FIG. 9 is a circuit diagram showing a configuration of a bidirectional chopper shown in FIG. 2 and its peripheral portion in more detail.

Next, the failure diagnosis of bidirectional chopper 8 will be described in more detail. FIG. 9 is a circuit diagram showing a configuration of bidirectional chopper 8 and its peripheral portion of uninterruptible power supply device U1 in more detail. In FIG. 9, bidirectional chopper 8 has a high-voltage node 8a, an intermediate-voltage node 8b, a low-voltage node 8c, a positive-voltage node 8d, and a negative-voltage node 8e. Uninterruptible power supply device U1 also includes switches S2a and S2b, and DC terminals T2a and T2b.

Nodes 8a to 8c are connected to DC lines 6a to 6c, respectively. One terminals of switches S2a and S2b are connected to nodes 8d and 8e, respectively. The other terminals of switches S2a and S2b are connected to DC terminals T2a and T2b, respectively.

Bidirectional chopper 8 is a well-known bidirectional chopper including a plurality of IGBT elements, a plurality of diodes, and a plurality of reactors. The turning on and off of each IGBT element is controlled by control unit 32 (FIG. 6). Battery 72 has a positive electrode and a negative electrode that are connected to DC terminals T2a and T2b, respectively.

When conducting a failure diagnosis of bidirectional chopper 8, control unit 32 first turns on switches S4a and S4b (FIG. 7) to reset each of terminal-to-terminal voltages Ep and En of capacitors 7a and 7b to 0 V. After turning off switches S4a and S4b, control unit 32 turns on switches S1a to S1c (FIG. 7) to perform preliminary charging of capacitors 7a and 7b. As a result, each of capacitors 7a and 7b is preliminarily charged to predetermined initial voltage V1. Terminal-to-terminal voltage VB of battery 72 is maintained at target voltage VBT by bidirectional choppers 8 of the other uninterruptible power supply devices U.

When the preliminary charging is completed, control unit 32 turns on switches S2a and S2b to connect bidirectional chopper 8 to battery 72. Then, control unit 32 operates bidirectional chopper 8 to alternately charge capacitors 7a and 7b for a predetermined amount of time. Terminal-to-terminal voltages Ep and En of capacitors 7a and 7b increase gradually.

Control unit 32 detects each of terminal-to-terminal voltages Ep and En of capacitors 7a and 7b after a predetermined amount of time (for example, 5 ms) has elapsed since the start of the operation of bidirectional chopper 8. Then, when the detected value of each of DC voltages Ep and En is within the normal range from V2 to V3, control unit 32 diagnoses bidirectional chopper 8 as not having a failure and sets failure detection signal φF3 to the "L" level, which is a deactivation level, and when the detected value is out of the normal range, control unit 32 diagnoses bidirectional chopper 8 as at least partially having a failure and sets failure detection signal φF3 to the "H" level, which is an activation level.

When uninterruptible power supply device U1 is put into the operating state while bidirectional chopper 8 at least partially has a failure, uninterruptible power supply device U1 may fail, which in turn may cause the uninterruptible power supply system to fail. In this first embodiment, therefore, failure detection signal φF3 is set to the "H" level to notify the user of the system that bidirectional chopper 8 at least partially has a failure.

Figure 10:
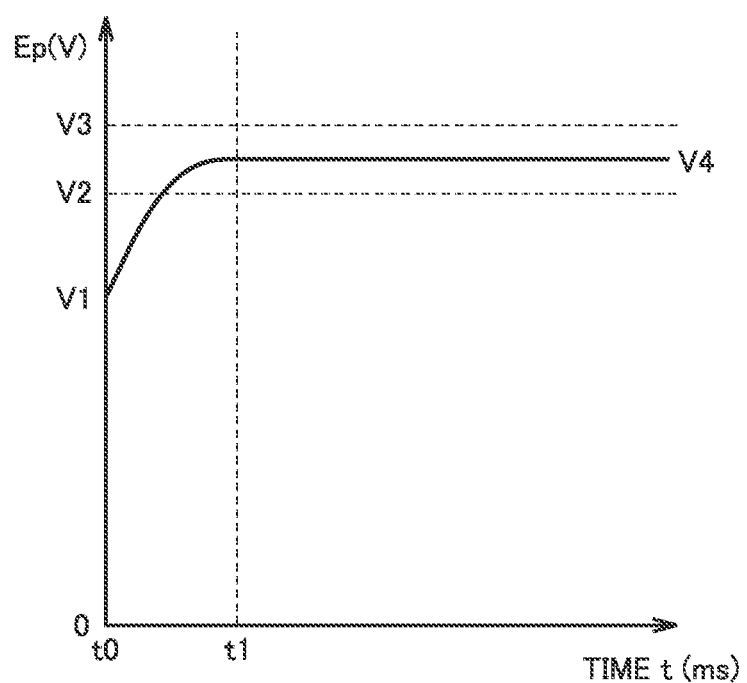
FIG. 10 is a time chart schematically showing a temporal variation in DC voltage Ep shown in FIG. 9.

FIG. 10 is a time chart schematically showing a temporal variation in terminal-to-terminal voltage Ep of capacitor 7a. FIG. 10 shows an example where bidirectional chopper 8 does not have a failure. At time t0, the preliminary charging has been completed and DC voltage Ep has been set to initial voltage V1. At time t0, the operation of bidirectional chopper 8 is started, causing DC voltage Ep to increase. At time t1, DC voltage Ep is detected. Since the detected value of DC voltage Ep is V4, which is within the normal range from V2 to V3, bidirectional chopper 8 is diagnosed as not having a failure.

When one of the plurality of IGBT elements included in bidirectional chopper 8 has a failure, for example, the detected value of DC voltage Ep is lower than the normal range from V2 to V3, and bidirectional chopper 8 is diagnosed as at least partially having a failure.

During the operating action, when power failure detection signal φ30 is at the "H" level (in the normal state of commercial AC power supply 71), control unit 32 operates bidirectional chopper 8 to charge battery 72 such that battery voltage VB becomes equal to a target voltage DBT.

During the operating action, when power failure detection signal φ30 is set to the "L" level (at the time of a power failure of commercial AC power supply 71), control unit 32 maintains switches S2a and S2b in the ON state, and operates bidirectional chopper 8 such that voltage VD which is the sum of DC voltages Ep and En becomes equal to target voltage VDT.

When corresponding device U1 fails during the operating action, and during the standby action, control unit 32 turns off switches S2a and S2b, and turns off all the IGBT elements of bidirectional chopper 8 to stop the operation of bidirectional chopper 8.

Figure 11:
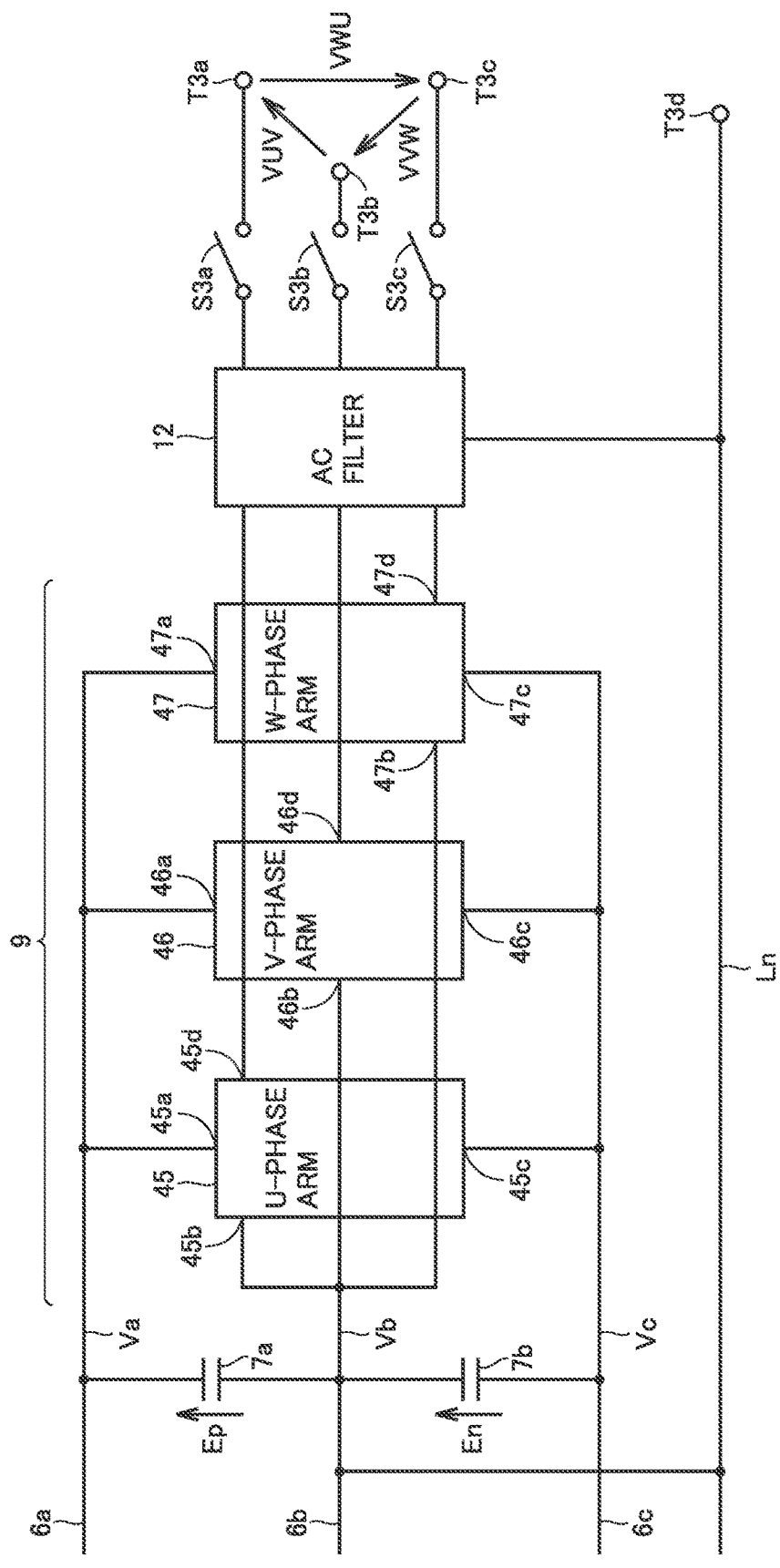
FIG. 11 is a circuit diagram showing a configuration of an inverter shown in FIG. 2 and its peripheral portion in more detail.

Next, the failure diagnosis of inverter 9 will be described in more detail. FIG. 11 is a circuit diagram showing a configuration of inverter 9 and its peripheral portion of uninterruptible power supply device U1 in more detail. In FIG. 11, this uninterruptible power supply device U1 actually supplies three-phase AC voltages VUV, VVW and VWU to load 73, and is connected to a neutral point of load 73.

Thus, in this uninterruptible power supply device U1, inverter 9 includes a U-phase arm 45, a V-phase arm 46, and a W-phase arm 47. This uninterruptible power supply device U1 also includes three switches S3a to S3c and four output terminals T3a to T3d.

U-phase arm 45 has a high-voltage node 45a, an intermediate-voltage node 45b, a low-voltage node 45c, and an AC node 45d. V-phase arm 46 has a high-voltage node 46a, an intermediate-voltage node 46b, a low-voltage node 46c, and an AC node 46d. W-phase arm 47 has a high-voltage node 47a, an intermediate-voltage node 47b, a low-voltage node 47c, and an AC node 47d.

High-voltage nodes 45a to 47a of arms 45 to 47 are all connected to DC line 6a. Intermediate-voltage nodes 45b to 47b of arms 45 to 47 are all connected to DC line 6b. Low-voltage nodes 45c to 47c of arms 45 to 47 are all connected to DC line 6c. AC nodes 45d to 47d of arms 45 to 47 are connected to one terminals of switches S3a to S3c through AC filter 12, respectively.

Each of arms 45 to 47 is a well-known arm including a plurality of IGBT elements and a plurality of diodes. The turning on and off of each IGBT element is controlled by control unit 32 (FIG. 6).

AC filter 12 is provided between inverter 9 and one terminals of switches S3a to S3c, and is connected to output terminal T3d through neutral point line Ln. AC filter 12 is a low-pass filter including a plurality of reactors and a plurality of capacitors.

AC filter 12 allows three-phase AC voltages VUV, VVW and VWU of a commercial frequency to pass through load 73, and prevents a signal of a switching frequency generated at inverter 9 from passing through the load 73 side. The signal of a switching frequency generated at inverter 9 flows out to neutral point line Ln through AC filter 12.

The other terminals of switches S3a to S3c are connected to output terminals T3a to T3c, respectively. Switches S3a to S3c are controlled by control unit 32 in the same manner as switch S3 (FIG. 2).

AC voltage VUV is provided between output terminals T3a and T3b. AC voltage VVW is provided between output terminals T3b and T3c. AC voltage VWU is provided between output terminals T3c and T3a. Output terminal T3d is connected to neutral point line Ln, and to the neutral point of load 73. Instantaneous values of three-phase AC voltages VUV, VVW and VWU are detected by control unit 32 (FIG. 6).

When conducting a failure diagnosis of inverter 9, control unit 32 first turns on switches S4a and S4b (FIG. 7) to reset each of terminal-to-terminal voltages Ep and En of capacitors 7a and 7b to 0 V. After turning off switches S4a and S4b, control unit 32 turns on switches S1a to S1c (FIG. 7) to perform preliminary charging of capacitors 7a and 7b. As a result, each of capacitors 7a and 7b is preliminarily charged to predetermined initial voltage V1.

Control unit 32 then operates converter 5 (FIG. 7) such that voltage VD=Ep+En which is the sum of terminal-to-terminal voltages Ep and En of capacitors 7a and 7b becomes equal to target voltage VDT. When DC voltage VD reaches target voltage VDT, control unit 32 turns off switches S1a to S1c to stop the operation of converter 5, and starts the operation of inverter 9.

U-phase arm 45 receives three-level DC voltages Va to Vc from DC lines 6a to 6c, and outputs a PWM signal Vu from AC node 45d. V-phase arm 46 receives three-level DC voltages Va to Vc from DC lines 6a to 6c, and outputs a PWM signal Vv from AC node 46d. W-phase arm 47 receives three-level DC voltages Va to Vc from DC lines 6a to 6c, and outputs a PWM signal Vw from AC node 47d.

Each of PWM signals Vu, Vv and Vw is a signal that changes to DC voltage Va or DC voltage Vc at a predetermined switching frequency with intermediate voltage Vb as a reference voltage, and has a commercial frequency. PWM signals Vu, Vv and Vw have phases that are offset from one another by 120 degrees.

A PWM signal Vuv=Vu−Vv appears between AC nodes 45d and 46d of arms 45 and 46. A PWM signal Vvw=Vv−Vw appears between AC nodes 46d and 47d of arms 46 and 47. A PWM signal Vwu=Vw−Vu appears between AC nodes 47a and 45a of arms 47 and 45.

PWM signals Vuv, Vvw and Vwu each have a commercial frequency, and have phases that are offset from one another by 120 degrees. PWM signals Vuv, Vvw and Vwu that have passed through AC filter 12 change to three-phase AC voltages VUV, VVW and VWU.

At this time, a current flows through a path formed by capacitors 7a and 7b, DC lines 6a to 6c, arms 45 to 47, AC filter 12, and neutral point line Ln, and power is consumed by resistive components of the reactors within AC filter 12 and the like, causing terminal-to-terminal voltages Ep and En of capacitors 7a and 7b to decrease. Power consumption by control unit 32 also causes terminal-to-terminal voltages Ep and En of capacitors 7a and 7b to decrease.

Control unit 32 detects each of terminal-to-terminal voltages Ep and En of capacitors 7a and 7b after a predetermined amount of time (for example, 3 ms) has elapsed since the start of the operation of inverter 9. Then, when the detected value of each of DC voltages Ep and En is within a normal range from V11 to V12, control unit 32 diagnoses inverter 9 as not having a failure and sets failure detection signal φF4 to the "L" level, and when the detected value is out of the normal range, control unit 32 diagnoses inverter 9 as at least partially having a failure and sets failure detection signal φF4 to the "H" level.

When uninterruptible power supply device U1 is put into the operating state while inverter 9 at least partially has a failure, uninterruptible power supply device U1 may fail, which in turn may cause the uninterruptible power supply system to fail. In this first embodiment, therefore, failure detection signal φF4 is set to the "H" level to notify the user of the system that inverter 9 at least partially has a failure.

Figure 12:
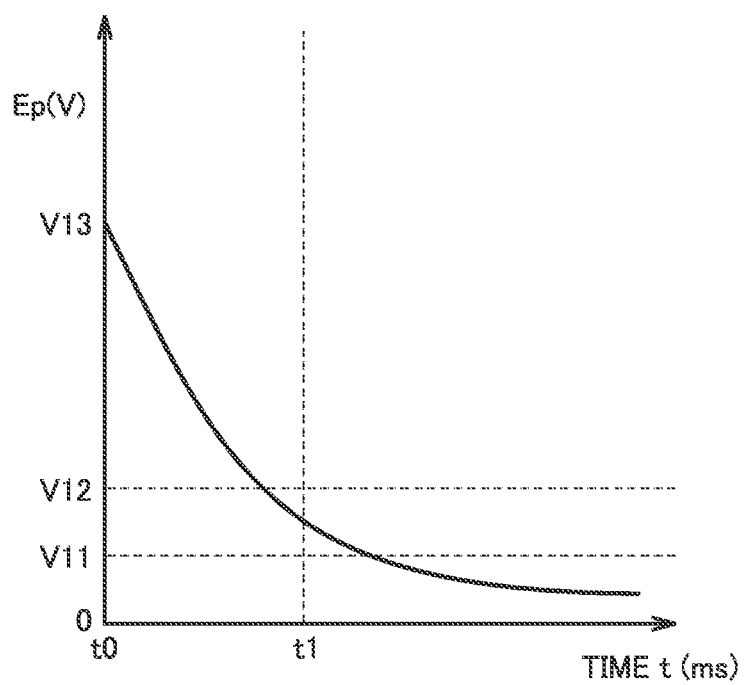
FIG. 12 is a time chart schematically showing a temporal variation in DC voltage Ep shown in FIG. 11.

FIG. 12 is a time chart schematically showing a temporal variation in terminal-to-terminal voltage Ep of capacitor 7a. FIG. 12 shows an example where inverter 9 does not have a failure. At time t0, DC voltage Ep is set to target voltage VDT (=V13). The operation of inverter 9 is started at time t0, and DC voltage Ep is detected at time t1. Since the detected value of DC voltage Ep at time t1 is within a normal range from V11 to V13, inverter 9 is diagnosed as not having a failure.

When one of three arms 45 to 47 has a failure, for example, the detected value of DC voltage Ep is higher than the normal range (from 50V to 80V), and inverter 9 is diagnosed as at least partially having a failure.

During the operating action, control unit 32 turns on switches S3a to S3c, and controls inverter 9 such that three-phase AC voltages VUV, VVW and VWU become equal to target voltages VUVT, VVWT and VWUT, respectively, and that AC output currents Iou, Iov and Iow become equal to a shared current Ios.

When corresponding device U1 fails during the operating action, and during the standby action, control unit 32 turns off switches S3a to S3c, and maintains all the IGBT elements of inverter 9 in the OFF state to stop the operation of inverter 9.

As described above, in this first embodiment, of N uninterruptible power supply devices U, selected M uninterruptible power supply devices U are put into the operating state, unselected (N-M) uninterruptible power supply device U is put into the standby state, and a failure diagnosis of the predetermined part (5, 8, 9) is conducted in uninterruptible power supply device U that has been put into the standby state. Therefore, it is possible to repair or replace uninterruptible power supply device U that has been diagnosed as having a failure at the predetermined part (5, 8, 9) with a new uninterruptible power supply device U before this failed device is put into the operating state, thereby preventing uninterruptible power supply device U in the operating state from failing, which stops the operation of load 73.

Second Embodiment

In the first embodiment, the description has been given of an example where each of converter 5, bidirectional chopper 8, and inverter 9 is a three-level circuit. In this second embodiment, a description will be given of an example where each of the converter, the bidirectional chopper, and the inverter is a two-level circuit.

Figure 13:
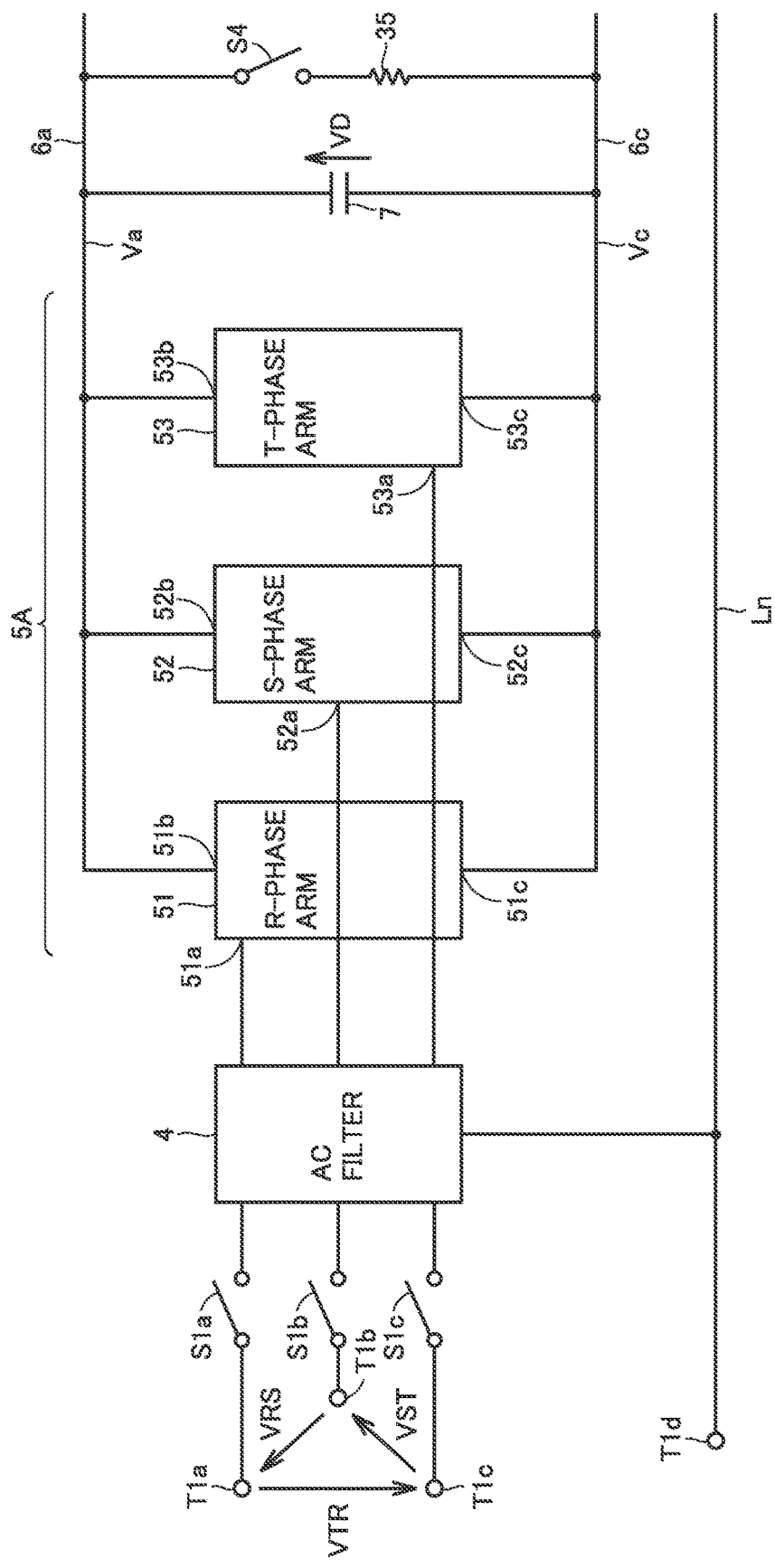
FIG. 13 is a circuit diagram showing a main part of an uninterruptible power supply system according to a second embodiment of the present disclosure.

FIG. 13 is a circuit diagram showing a main part of an uninterruptible power supply system according to this second embodiment, and is contrasted with FIG. 7. FIG. 13 is different from FIG. 7 in that converter 5 has been replaced with a converter 5A, DC line 6b has been removed, capacitors 7a and 7b have been replaced with a capacitor 7, and switches S4a and S4b and resistive elements 35a and 35b have been replaced with a switch S4 and a resistive element 35, respectively.

Converter 5A includes an R-phase arm 51, an S-phase arm 52, and a T-phase arm 53. R-phase arm 51 has an AC node

51a, a high-voltage node 51b, and a low-voltage node 51c. S-phase arm 52 has an AC node 52a, a high-voltage node 52b, and a low-voltage node 52c. T-phase arm 53 has an AC node 53a, a high-voltage node 53b, and a low-voltage node 53c.

AC nodes 51a to 51c of arms 51 to 53 are connected to the other terminals of switches S1a to S1c through AC filter 4, respectively. High-voltage nodes 51b to 53b of arms 51 to 53 are all connected to DC line 6a. Low-voltage nodes 51c to 53c of arms 51 to 53 are all connected to DC line 6c.

Each of arms 51 to 53 is a well-known arm including a plurality of IGBT elements and a plurality of diodes. The turning on and off of each IGBT element is controlled by control unit 32 (FIG. 6).

Capacitor 7 is connected between DC lines 6a and 6c, and smooths DC voltage VD between DC lines 6a and 6c. An instantaneous value of DC voltage VD is detected by control unit 32. Switch S4 and resistive element 35 are connected in series between DC lines 6a and 6c. Switch S4 is controlled by control unit 32, and is turned off normally and turned on when terminal-to-terminal voltage VD of capacitor 7 is reset to 0 V during the diagnostic action.

When conducting a failure diagnosis of converter 5A, control unit 32 first turns on switch S4. When switch S4 is turned on, a current flows from one terminal of capacitor 7 to the other terminal of capacitor 7 through DC line 6a, switch S4, resistive element 35, and DC line 6c, and thus, capacitor 7 is discharged and terminal-to-terminal voltage VD of capacitor 7 is reset to 0 V. When DC voltage VD is reset to 0 V, control unit 32 turns off switch S4.

Control unit 32 then turns on switches S1a to S1c to perform preliminary charging of capacitors 7a and 7b. When switches S1a to S1c are turned on, three-phase AC voltages VRS, VST and VTR are supplied from commercial AC power supply 71 to converter 5A through switches S1a to S1c and AC filter 4.

The plurality of diodes included in arms 51 to 53 of converter 5A form a three-phase full-wave rectifier circuit. Thus, capacitor 7 is preliminarily charged to a predetermined DC voltage. If the DC voltages on DC lines 6a and 6c are Va and Vc, respectively, then Va−Vc=VD.

When the preliminary charging is completed, control unit 32 starts the operation of converter 5A. R-phase arm 51 receives two-level DC voltages Va and Vc from DC lines 6a and 6c, and outputs PWM signal Vr from AC node 51a. S-phase arm 52 receives two-level DC voltages Va and Vc from DC lines 6a and 6c, and outputs PWM signal Vs from AC node 52a. T-phase arm 53 receives two-level DC voltages Va and Vc from DC lines 6a and 6c, and outputs PWM signal Vt from AC node 53a.

Each of PWM signals Vr, Vs and Vt is a signal that changes to DC voltage Va at a predetermined switching frequency with DC voltage Vc as a reference voltage, and has a commercial frequency. PWM signals Vr, Vs and Vt have phases that are offset from one another by 120 degrees.

PWM signal Vrs=Vr−Vs appears between AC nodes 51a and 52a of arms 51 and 52. PWM signal Vst=Vs−Vt appears between AC nodes 52a and 53a of arms 52 and 53. PWM signal Vtr=Vt−Vr appears between AC nodes 53a and 51a of arms 53 and 51.

PWM signals Vrs, Vst and Vts each have a commercial frequency, and have phases that are offset from one another by 120 degrees. PWM signals Vrs, Vst and Vts that have passed through AC filter 4 change to three-phase AC voltages VRSc, VSTc and VTSc.

When the phases of three-phase AC voltages VRSc, VSTc and VTSc are delayed from the phases of three-phase AC voltages VRS, VST and VTS, power is supplied from commercial AC power supply 71 to capacitor 7 through converter 5A, causing terminal-to-terminal voltage VD of capacitor 7 to increase.

When the phases of three-phase AC voltages VRSc, VSTc and VTSc are advanced from the phases of three-phase AC voltages VRS, VST and VTS, power is regenerated from capacitor 7 to commercial AC power supply 71 through converter 5A, causing terminal-to-terminal voltage VD of capacitor 7 to decrease.

During the diagnostic action, the phases of three-phase AC voltages VRSc, VSTc and VTSc are set to be delayed from the phases of three-phase AC voltages VRS, VST and VTS by a predetermined degree. Therefore, when the operation of converter 5A is started after the preliminary charging has been completed, terminal-to-terminal voltage VD of capacitor 7 increases. DC voltage VD increases in the same manner as DC voltage Ep (see FIG. 8).

Control unit 32 detects terminal-to-terminal voltage VD of capacitor 7 after a predetermined amount of time (for example, 5 ms) has elapsed since the turning on of switches S1a to S1c. Then, when the detected value of DC voltage VD is within a normal range, control unit 32 diagnoses converter 5A as not having a failure and sets failure detection signal ϕF2 to the "L" level, which is a deactivation level, and when the detected value is out of the normal range, control unit 32 diagnoses converter 5A as at least partially having a failure and sets failure detection signal ϕF2 to the "H" level, which is an activation level.

When uninterruptible power supply device U1 is put into the operating state while converter 5A at least partially has a failure, uninterruptible power supply device U1 may fail, which in turn may cause the uninterruptible power supply system to fail. In this second embodiment, therefore, failure detection signal ϕF2 is set to the "H" level to notify the user of the system that converter 5A at least partially has a failure.

When one of three arms 51 to 53 has a failure, for example, the detected value of DC voltage VD is lower than the normal range, and converter 5A is diagnosed as at least partially having a failure.

It may alternatively be that terminal-to-terminal voltage VD of capacitor 7 is detected at a time when a predetermined amount of time (for example, 2 ms) has elapsed since the time when the operation of converter 5A was started, and converter 5A is diagnosed as not having a failure when the detected value of DC voltage VD is within the normal range, and converter 5A is diagnosed as at least partially having a failure when the detected value is out of the normal range.

During the operating action, when power failure detection signal ϕ30 is at the "H" level (in the normal state of commercial AC power supply 71), control unit 32 adjusts the phase difference between three-phase AC voltages VRSc, VSTc, VTSc and three-phase AC voltages VRS, VST, VTS such that DC voltage VD becomes equal to target voltage VDT.

During the operating action, when power failure detection signal ϕ30 is set to the "L" level (at the time of a power failure of commercial AC power supply 71) and when corresponding device U1 fails, control unit 32 turns off switches S1a to S1c, and turns off all the IGBT elements of converter 5A to stop the operation of converter 5A.

During the standby action, control unit 32 turns off switches S1a to S1c, and turns off all the IGBT elements of converter 5A to stop the operation of converter 5A, as in the case of a power failure.

Figure 14:
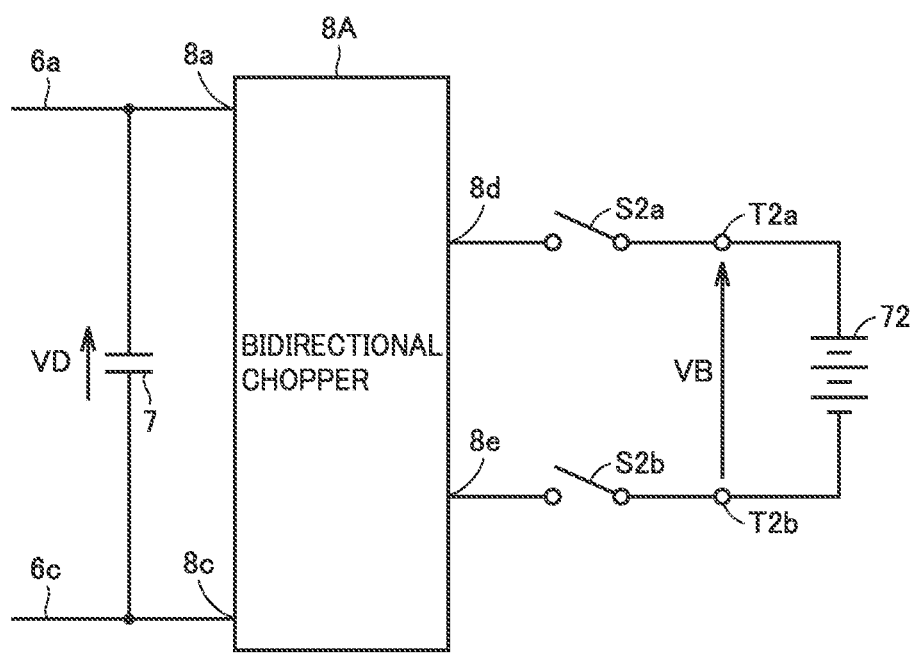
FIG. 14 is a circuit diagram showing a configuration of a bidirectional chopper connected to a converter shown in FIG. 13 and its peripheral portion.

FIG. 14 is a circuit diagram showing a configuration of a bidirectional chopper 8A connected to converter 5A shown in FIG. 13 and its peripheral portion. In FIG. 14, bidirectional chopper 8A has high-voltage node 8a, low-voltage node 8c, positive-voltage node 8d, and negative-voltage node 8e.

Nodes 8a and 8c are connected to DC lines 6a and 6c, respectively. One terminals of switches S2a and S2b are connected to nodes 8d and 8e, respectively. The other terminals of switches S2a and S2b are connected to DC terminals T2a and T2b, respectively.

Bidirectional chopper 8A is a well-known bidirectional chopper including a plurality of IGBT elements, a plurality of diodes, and reactors. The turning on and off of each IGBT element is controlled by control unit 32 (FIG. 6). Battery 72 has a positive electrode and a negative electrode that are connected to DC terminals T2a and T2b, respectively.

When conducting a failure diagnosis of bidirectional chopper 8A, control unit 32 first turns on switch S4 (FIG. 13) to reset terminal-to-terminal voltage VD of capacitor 7 to 0 V. After turning off switch S4, control unit 32 turns on switches S1a to S1c (FIG. 13) to perform preliminary charging of capacitor 7. As a result, capacitor 7 is preliminarily charged to a predetermined initial voltage. Terminal-to-terminal voltage VB of battery 72 is maintained at target voltage VBT by bidirectional choppers 8A of the other uninterruptible power supply devices U.

When the preliminary charging is completed, control unit 32 turns on switches S2a and S2b to connect bidirectional chopper 8A to battery 72. Then, control unit 32 operates bidirectional chopper 8A to charge capacitor 7. Terminal-to-terminal voltage VD of capacitor 7 increases gradually. DC voltage VD increases in the same manner as DC voltage Ep (see FIG. 10).

Control unit 32 detects terminal-to-terminal voltage VD of capacitor 7 after a predetermined amount of time (for example, 5 ms) has elapsed since the start of the operation of bidirectional chopper 8A. Then, when the detected value of DC voltage VD is within a normal range, control unit 32 diagnoses bidirectional chopper 8A as not having a failure and sets failure detection signal $\phi$F3 to the "L" level, which is a deactivation level, and when the detected value is out of the normal range, control unit 32 diagnoses bidirectional chopper 8A as at least partially having a failure and sets failure detection signal $\phi$F3 to the "H" level, which is an activation level.

When uninterruptible power supply device U1 is put into the operating state while bidirectional chopper 8A at least partially has a failure, uninterruptible power supply device U1 may fail, which in turn may cause the uninterruptible power supply system to fail. In this second embodiment, therefore, failure detection signal $\phi$F3 is set to the "H" level to notify the user of the system that bidirectional chopper 8A at least partially has a failure.

When one of the plurality of IGBT elements included in bidirectional chopper 8A has a failure, for example, the detected value of DC voltage VD is lower than the normal range, and bidirectional chopper 8A is diagnosed as at least partially having a failure.

During the operating action, when power failure detection signal $\phi$30 is at the "H" level (in the normal state of commercial AC power supply 71), control unit 32 operates bidirectional chopper 8A to charge battery 72 such that battery voltage VB becomes equal to target voltage DBT.

During the operating action, when power failure detection signal $\phi$30 is set to the "L" level (at the time of a power failure of commercial AC power supply 71), control unit 32 maintains switches S2a and S2b in the ON state, and operates bidirectional chopper 8A such that DC voltage VD becomes equal to target voltage VDT.

When corresponding device U1 fails during the operating action, and during the standby action, control unit 32 turns off switches S2a and S2b, and turns off all the IGBT elements of bidirectional chopper 8A to stop the operation of bidirectional chopper 8A.

Figure 15:
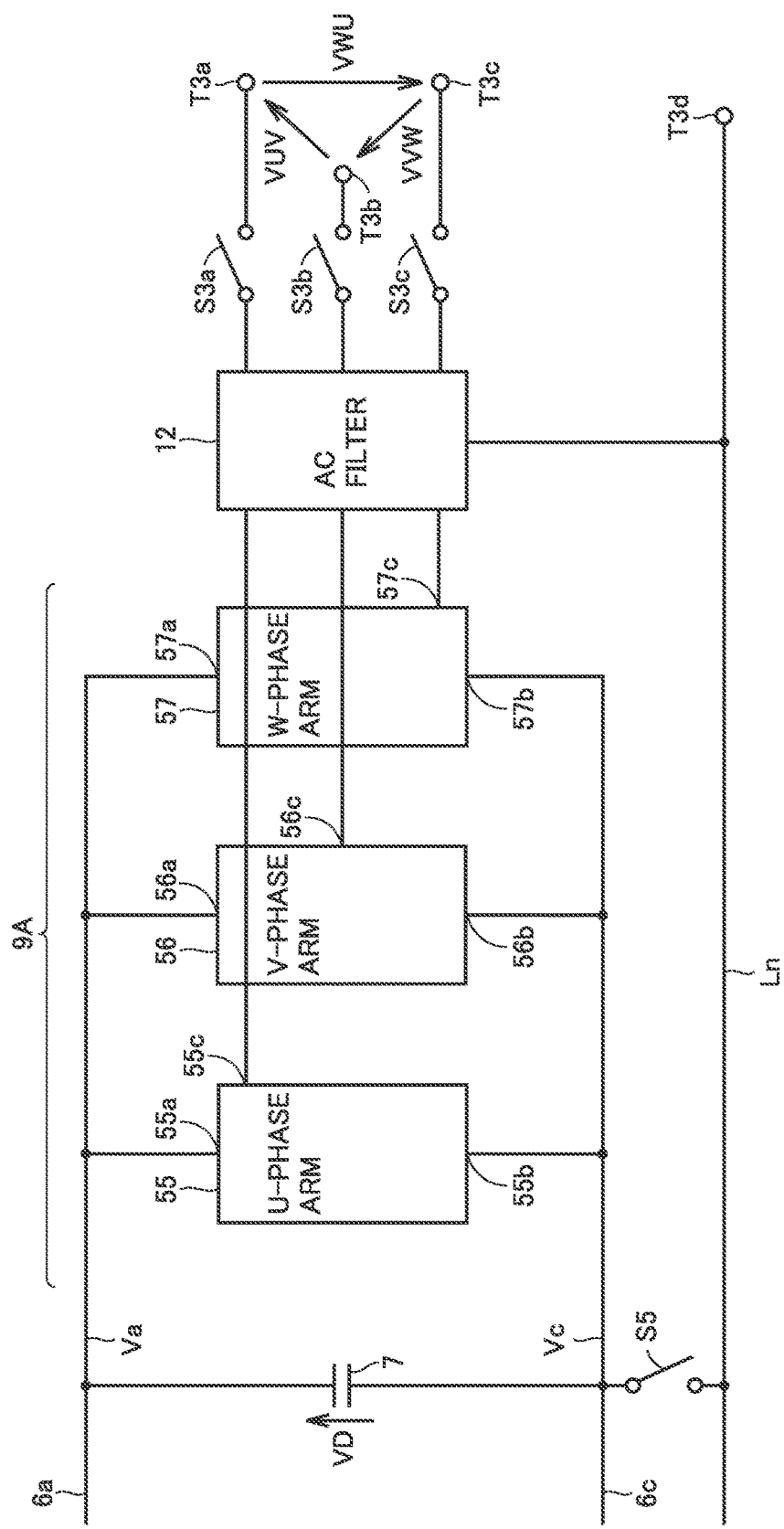
FIG. 15 is a circuit diagram showing a configuration of an inverter connected to the converter shown in FIG. 13 and its peripheral portion.

FIG. 15 is a circuit diagram showing an inverter 9A connected to converter 5A shown in FIG. 13 and its peripheral portion. In FIG. 15, inverter 9A includes a U-phase arm 55, a V-phase arm 56, and a W-phase arm 57. This uninterruptible power supply device U1 also includes a switch S5.

U-phase arm 55 has a high-voltage node 55a, a low-voltage node 55b, and an AC node 55c. V-phase arm 56 has a high-voltage node 56a, a low-voltage node 56b, and an AC node 56c. W-phase arm 57 has a high-voltage node 57a, a low-voltage node 57b, and an AC node 57c.

High-voltage nodes 55a to 57a of arms 55 to 57 are all connected to DC line 6a. Low-voltage nodes 55b to 57b of arms 55 to 57 are all connected to DC line 6c. AC nodes 55c to 57c of arms 55 to 57 are connected to one terminals of switches S3a to S3c through AC filter 12, respectively.

Each of arms 55 to 57 is a well-known arm including a plurality of IGBT elements and a plurality of diodes. The turning on and off of each IGBT element is controlled by control unit 32 (FIG. 6).

Switch S5 is connected between DC line 6c and neutral point line Ln. The turning on and off of switch S5 is controlled by control unit 32. Switch S5 is turned off normally and turned on during a failure diagnosis of inverter 9A.

AC filter 12 is provided between inverter 9A and one terminals of switches S3a to S3c, and is connected to output terminal T3d through neutral point line Ln. AC filter 12 is a low-pass filter including a plurality of reactors and a plurality of capacitors.

AC filter 12 allows three-phase AC voltages VUV, VVW and VWU of a commercial frequency to pass through load 73, and prevents a signal of a switching frequency generated at inverter 9A from passing through the load 73 side. The signal of a switching frequency generated at inverter 9A flows out to neutral point line Ln through AC filter 12.

The other terminals of switches S3a to S3c are connected to output terminals T3a to T3c, respectively. Switches S3a to S3c are controlled by control unit 32 in the same manner as switch S3 (FIG. 2).

AC voltage VUV is provided between output terminals T3a and T3b. AC voltage VVW is provided between output terminals T3b and T3c. AC voltage VWU is provided between output terminals T3c and T3a. Output terminal T3d is connected to neutral point line Ln, and to the neutral point of load 73. Instantaneous values of three-phase AC voltages VUV, VVW and VWU are detected by control unit 32 (FIG. 6).

When conducting a failure diagnosis of inverter 9A, control unit 32 first turns on switch S4 (FIG. 13) to reset terminal-to-terminal voltage VD of capacitor 7 to 0 V. After turning off switch S4, control unit 32 turns on switches S1a to S1c (FIG. 7) to perform preliminary charging of capacitor 7. As a result, capacitor 7 is preliminarily charged to a predetermined initial voltage.

Control unit 32 then operates converter 5A (FIG. 13) such that terminal-to-terminal voltage VD of capacitor 7 becomes equal to target voltage VDT. When DC voltage VD reaches target voltage VDT, control unit 32 turns off switches S1a to S1c to stop the operation of converter 5A, and turns on switch S5 to start the operation of inverter 9A.

U-phase arm 55 receives two-level DC voltages Va and Vc from DC lines 6a and 6c, and outputs PWM signal Vu from AC node 55c. V-phase arm 56 receives two-level DC voltages Va and Vc from DC lines 6a and 6c, and outputs PWM signal Vv from AC node 56c. W-phase arm 57 receives two-level DC voltages Va and Vc from DC lines 6a and 6c, and outputs PWM signal Vw from AC node 57c.

Each of PWM signals Vu, Vv and Vw is a signal that changes to DC voltage Va at a predetermined switching frequency with DC voltage Vc as a reference voltage, and has a commercial frequency. PWM signals Vu, Vv and Vw have phases that are offset from one another by 120 degrees.

PWM signal Vuv=Vu−Vv appears between AC nodes 55c and 56c of arms 55 and 56. PWM signal Vvw=Vv−Vw appears between AC nodes 56c and 57c of arms 56 and 57. PWM signal Vwu=Vw−Vu appears between AC nodes 57c and 55c of arms 57 and 55.

PWM signals Vuv, Vvw and Vwu each have a commercial frequency, and have phases that are offset from one another by 120 degrees. PWM signals Vuv, Vvw and Vwu that have passed through AC filter 12 change to three-phase AC voltages VUV, VVW and VWU.

At this time, a current flows through a path formed by capacitor 7, DC lines 6a and 6c, arms 55 to 57, AC filter 12, neutral point line Ln, and switch S5, and power is consumed by the resistive components of the reactors within AC filter 12 and the like, causing terminal-to-terminal voltage VD of capacitor 7 to decrease. Power consumption by control unit 32 also causes terminal-to-terminal voltage VD of capacitor 7 to decrease. DC voltage VD decreases in the same manner as DC voltage Ep (see FIG. 12).

Control unit 32 detects terminal-to-terminal voltage VD of capacitor 7 after a predetermined amount of time (for example, 3 ms) has elapsed since the start of the operation of inverter 9A. Then, when the detected value of DC voltage VD is within a normal range, control unit 32 diagnoses inverter 9A as not having a failure and sets failure detection signal φF4 to the "L" level, and when the detected value is out of the normal range, control unit 32 diagnoses inverter 9A as at least partially having a failure and sets failure detection signal φF4 to the "H" level.

When uninterruptible power supply device U1 is put into the operating state while inverter 9A at least partially has a failure, uninterruptible power supply device U1 may fail, which in turn may cause the uninterruptible power supply system to fail. In this second embodiment, therefore, failure detection signal φF4 is set to the "H" level to notify the user of the system that inverter 9A at least partially has a failure.

When one of three arms 55 to 57 has a failure, for example, the detected value of DC voltage VD is higher than the normal range, and inverter 9A is diagnosed as at least partially having a failure.

During the operating action, control unit 32 turns on switches S3a to S3c, and controls inverter 9A such that three-phase AC voltages VUV, VVW and VWU become equal to target voltages VUVT, VVWT and VWUT, respectively, and that AC output currents Iou, Iov and Iow become equal to shared current Ios.

When corresponding device U1 fails during the operating action, and during the standby action, control unit 32 turns off switches S3a to S3c, and maintains all the IGBT elements of inverter 9A in the OFF state to stop the operation of inverter 9A.

Since the configuration and operation are otherwise the same as those of the first embodiment, description thereof will not be repeated. The same effect as that of the first embodiment is obtained in this second embodiment as well.

It should be understood that the embodiments disclosed herein are illustrative and non-restrictive in every respect. The present disclosure is defined by the terms of the claims, rather than the description above, and is intended to include any modifications within the scope and meaning equivalent to the terms of the claims.

REFERENCE SIGNS LIST

U1 to U6 uninterruptible power supply device; B1 to B3 circuit breaker; 1 communication cable; T1, T1a to T1d input terminal; T2, T2a, T2b DC terminal; T3, T3a to T3d output terminal; T4 communication terminal; S1 to S3, S1a to S1c, S2a, S2b, S3a to S3c, S4a, S4b, S5 switch; 2, 7, 7a, 7b, 11 capacitor; 3, 10 reactor; 4, 12 AC filter; 5, 5A converter; 6, 6a to 6c DC line; 8, 8A bidirectional chopper; 9, 9A inverter; 13 current detector; 14 operation unit; 15 control circuit; 21 communication unit; 22 signal generation unit; 23 load current computation unit; 24 appropriate number computation unit; 25 shared current computation unit; 26 timer; 27 selection unit; 28 operating time detection unit; 29 command unit; 30 power failure detector; 31 control power supply; 32 control unit; 33 notification unit; 35a, 35b resistive element; 41 to 43, 45 to 47, 51 to 53, 55 to 57 arm; 71 commercial AC power supply; 72 battery; 73 load.

The invention claimed is:

1. An uninterruptible power supply system including a plurality of uninterruptible power supply devices connected in parallel to a load, the uninterruptible power supply system comprising
a selection unit that selects, of the plurality of uninterruptible power supply devices, a necessary number of uninterruptible power supply devices to supply power to the load, wherein
each of the uninterruptible power supply devices performs
when this uninterruptible power supply device is selected by the selection unit, an operating action of supplying power to the load,
when this uninterruptible power supply device is not selected by the selection unit, a standby action of standing by without supplying power to the load, and
during the standby action, a diagnostic action of diagnosing whether or not a predetermined part of this uninterruptible power supply device has a failure, and
the selection unit changes uninterruptible power supply devices to be selected, such that the plurality of uninterruptible power supply devices have an equal operating time.

2. The uninterruptible power supply system according to claim 1, wherein
each of the uninterruptible power supply devices performs, when the operating time of this uninterruptible power supply device exceeds a predetermined amount of time, the diagnostic action during the standby action.

3. The uninterruptible power supply system according to claim 1, wherein
the selection unit changes, in a predetermined cycle, uninterruptible power supply devices to be selected, such that the plurality of uninterruptible power supply devices have an equal operating time.

4. The uninterruptible power supply system according to claim 1, wherein
each of the uninterruptible power supply devices includes
a DC line that transmits DC power,
a capacitor connected to the DC line, a first power converter that converts AC power supplied from an AC power supply into DC power and supplies the DC power to the DC line, a second power converter that provides and receives DC power between the DC line and a power storage device, and a third power converter that converts DC power received from the DC line into AC power and supplies the AC power to the load, and the predetermined part is one of the first to third power converters.

5. The uninterruptible power supply system according to claim 4, wherein each of the uninterruptible power supply devices further includes a first switch connected between the AC power supply and the first power converter, a second switch connected between the second power converter and the power storage device, a third switch connected between the third power converter and the load, and a control circuit that controls the first to third switches and the first to third power converters, and the control circuit during the operating action, turns on the first to third switches and operates the first to third power converters, during the standby action, turns off the first to third switches and stops the operation of the first to third power converters, and during the diagnostic action, turns on at least one of the first and second switches and turns off the third switch, operates at least one of the first to third power converters, and diagnoses whether or not the at least one of the power converters has a failure.

6. The uninterruptible power supply system according to claim 5, wherein during the diagnostic action, the control circuit sets a DC voltage on the DC line to a predetermined voltage value, turns on the first switch, operates the first power converter, and diagnoses whether or not the first power converter has a failure based on a temporal variation in the DC voltage on the DC line.

7. The uninterruptible power supply system according to claim 5, wherein during the diagnostic action, the control circuit sets a DC voltage on the DC line to a predetermined voltage value, turns on the second switch, operates the second power converter, and diagnoses whether or not the second power converter has a failure based on a temporal variation in the DC voltage on the DC line.

8. The uninterruptible power supply system according to claim 5, wherein during the diagnostic action, the control circuit sets a DC voltage on the DC line to a predetermined voltage value, operates the third power converter, and diagnoses whether or not the third power converter has a failure based on a temporal variation in the DC voltage on the DC line.

9. The uninterruptible power supply system according to claim 4, wherein when AC power is normally supplied from the AC power supply during the operating action, the AC power supplied from the AC power supply is converted into DC power by the first power converter, the DC power is converted into AC power by the third power converter, and the AC power is supplied to the load and stored in the power storage device by the second power converter, and when AC power is not normally supplied from the AC power supply during the operating action, operation of the first power converter is stopped, DC power in the power storage device is supplied to the third power converter by the second power converter, and the DC power is converted into AC power and supplied to the load by the third power converter.

10. The uninterruptible power supply system according to claim 1, wherein each of the uninterruptible power supply devices stops, when this uninterruptible power supply device fails during the operating action, execution of the operating action.

11. The uninterruptible power supply system according to claim 1, wherein each of the uninterruptible power supply devices includes a notification unit, the notification unit providing, when the predetermined part of this uninterruptible power supply device is diagnosed as having a failure, a notification to that effect.

12. The uninterruptible power supply system according to claim 1, having a hot swap function for replacing an uninterruptible power supply device that has been diagnosed as at least partially having a failure with a new uninterruptible power supply device, while supplying power to the load from uninterruptible power supply devices selected by the selection unit.

* * * * *